United States Patent
Lee et al.

(10) Patent No.: US 12,334,370 B2
(45) Date of Patent: Jun. 17, 2025

(54) APPARATUS AND METHOD FOR TREATING SUBSTRATE

(71) Applicant: Semes Co., Ltd, Cheonan-si (KR)

(72) Inventors: Sangmin Lee, Seoul (KR); Woo Young Kim, Cheonan-si (KR); Joo Jib Park, Asan-si (KR); Boong Kim, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 389 days.

(21) Appl. No.: 17/726,721

(22) Filed: Apr. 22, 2022

(65) Prior Publication Data

US 2022/0246452 A1 Aug. 4, 2022

Related U.S. Application Data

(62) Division of application No. 16/133,043, filed on Sep. 17, 2018, now Pat. No. 11,367,635.

(30) Foreign Application Priority Data

Sep. 27, 2017 (KR) .......................... 10-2017-0125467

(51) Int. Cl.
*H01L 21/67* (2006.01)
*H01L 21/02* (2006.01)
(Continued)

(52) U.S. Cl.
CPC .. *H01L 21/67126* (2013.01); *H01L 21/02101* (2013.01); *H01L 21/67028* (2013.01);
(Continued)

(58) Field of Classification Search
CPC ......... H01L 21/67126; H01L 21/67028; H01L 21/68742
See application file for complete search history.

(56) References Cited

U.S. PATENT DOCUMENTS 6,602,346 B1 8/2003 Gochberg et al.
2008/0187430 A1 8/2008 Datta et al.
(Continued)

FOREIGN PATENT DOCUMENTS

CN 102751173 A 10/2012
CN 105575855 A 5/2016
(Continued)

OTHER PUBLICATIONS

KR-101180842-B1 and translation (Year: 2012).*
(Continued)

*Primary Examiner* — Steven S Anderson, II
(74) *Attorney, Agent, or Firm* — Harness, Dickey & Pierce, P.L.C.

(57) ABSTRACT

Provided are an apparatus and a method for treating a substrate at a high-pressure atmosphere. The apparatus for treating the substrate includes a first body and a second body combined with each other to define a treatment space in which the substrate is treated, a sealing member interposed between the first body and the second body to seal the treatment space from an outside at a position in which the first body is in close contact with the second body, and a driving member to drive the first body or the second body such that the treatment space is open or closed. The sealing member is positioned in a sealing groove formed in the first body. The sealing member is deformed to be in close contact with the second body by pressure of the treatment space when a process is performed.

18 Claims, 18 Drawing Sheets

(51) Int. Cl.
  *H01L 21/673* (2006.01)
  *H01L 21/687* (2006.01)

(52) U.S. Cl.
  CPC .. *H01L 21/67034* (2013.01); *H01L 21/67051* (2013.01); *H01L 21/67109* (2013.01); *H01L 21/6715* (2013.01); *H01L 21/6719* (2013.01); *H01L 21/67393* (2013.01); *H01L 21/68721* (2013.01); *H01L 21/68742* (2013.01)

(56) References Cited

U.S. PATENT DOCUMENTS

| | | | | |
|---|---|---|---|---|
| 2016/0121374 | A1* | 5/2016 | Lee | H01L 21/6719 134/182 |
| 2017/0008040 | A1* | 1/2017 | Jeong | H01L 21/67017 |
| 2018/0102266 | A1* | 4/2018 | Kunsch | H01L 21/67126 |

FOREIGN PATENT DOCUMENTS

| | | | |
|---|---|---|---|
| KR | 100543361 | B1 | 1/2006 |
| KR | 101180842 | B1 * | 9/2012 |
| KR | 20120119995 | A | 11/2012 |
| KR | 20150073527 | A | 7/2015 |
| KR | 101572746 | B1 | 11/2015 |
| KR | 20150123953 | A | 11/2015 |
| KR | 20170106792 | A | 9/2017 |
| KR | 20180045961 | A | 5/2018 |

OTHER PUBLICATIONS

Office Action dated Jan. 4, 2021 for corresponding U.S. Appl. No. 16/133,043.
Advisory Action dated Oct. 13, 2021 for corresponding U.S. Appl. No. 16/133,043.
Chinese Office Action dated Nov. 2, 2022 from corresponding Chinese Patent Application No. 201811133462.5.

* cited by examiner

APPARATUS AND METHOD FOR TREATING SUBSTRATE

CROSS-REFERENCE TO RELATED APPLICATIONS

This application is a divisional of U.S. application Ser. No. 16/133,043, filed Sep. 17, 2018, which claims priority under 35 U.S.C. § 119 to Korean Patent Application No. 10-2017-0125467 filed on Sep. 27, 2017, in the Korean Intellectual Property Office, the disclosures of which are incorporated by reference herein in their entireties.

BACKGROUND

Embodiments of the inventive concept described herein related to an apparatus and a method for treating a substrate, and more particularly to an apparatus and a method for treating a substrate under a high-pressure atmosphere.

In order to manufacture a semiconductor device, a desired pattern is formed on a substrate through various processes such as, photolithography, etching, ashing, ion implantation, and thin film deposition. Various treatment liquids are used in the processes, and contaminants and particles are produced during the process. In order to remove these contaminants and particles, a rinsing process for rinsing the contaminants and the particles is essentially performed before and after each process.

In general, after the rinsing process is performed by chemicals or a rinse liquid, a drying process is performed. According to the drying process, which is to dry a rinse liquid remaining on the substrate, an organic solvent, such as isopropyl alcohol (IPA), having a surface tension lower than that of a rinse liquid is substituted for a rinse liquid on the substrate and then is removed. However, the critical dimension (CD) between patterns formed on the substrate is reduced to a fine size, the organic solvent remaining in the space between the patterns is not easily removed.

Recently, a process of removing the organic solvent remaining on the substrate is performed by using a supercritical fluid. The supercritical process is performed in a high-pressure space sealed from the outside to satisfy a specific condition of the supercritical fluid. Accordingly, two bodies are made to be in close contact with each other with strong force to maintain the high-pressure space which is sealed.

FIG. 1 is a sectional view illustrating an apparatus for sealing a treatment space using fluid pressure. Referring to FIG. 1, any one of an upper body 2 and a lower body 4 is pushed toward a remaining one and makes close contact with the remaining one by the fluid pressure. However, in the process that the bodies 2 and 4 make close contact with each other, the bodies 2 and 4 collide with each other to product particles.

In addition, a sealing member is interposed between the upper body 2 and the lower body 4 to seal the gap between the upper body 2 and the lower body 4. However, the sealing member may be damaged by force allowing the bodies 2 and 4 to be in contact with each other. In addition, when a long time is elapsed, the intrinsic function of the sealing member may not be performed.

In addition, to seal the high-pressure space, a driving member such as a cylinder applies strong force to the bodies 2 and 4. However, when a long time is elapsed, the driving member may be broken, thereby causing the process failure.

As a prior art, there is disclosed Korean Unexamined Patent Publication No. 2014-0030218.

SUMMARY

Embodiments of the inventive concept provide an apparatus and a method, capable of minimizing the production of particles in a process of sealing a treatment space.

Embodiments of the inventive concept provide an apparatus and a method, capable preventing a sealing member from being damaged in the process of sealing a treatment space.

According to an exemplary embodiment, there is provided an apparatus for treating a substrate at a high-pressure atmosphere. The apparatus for treating the substrate includes a first body and a second body combined with each other to define a treatment space in which the substrate is treated, a substrate support unit to support the substrate in the treatment space, a fluid supply unit to supply a fluid to the substrate supported by the substrate support unit, a heating member to heat the treatment space such that a fluid supplied to the treatment space is heated to a critical temperature or more, a sealing member interposed between the first body and the second body to seal the treatment space from an outside at a position in which the first body is in close contact with the second body, and a driving member to drive the first body or the second body such that the treatment space is open or closed. The sealing member is positioned in a sealing groove formed in the first body. The sealing member is deformed to be in close contact with the second body by pressure of the treatment space when a process is performed.

The sealing member may be provided in an annular ring shape, and an end of the sealing member may be a free end. The sealing member has a shape rounded in a direction of approaching a central axis toward the end from one end which is opposite to the end, and the end may be deformed in a direction of being apart from the central axis when the process is performed. The one end may be fixedly coupled to the first body.

In addition, an apparatus for treating a substrate includes a first body and a second body combined with each other to define a treatment space in which the substrate is treated, a substrate support unit to support the substrate in the treatment space, a fluid supply unit to supply a fluid to the substrate supported by the substrate support unit, a heating member to heat the treatment space such that a fluid supplied to the treatment space is heated to a critical temperature or more, a sealing member interposed between the first body and the second body to seal the treatment space from an outside at a position in which the first body is in close contact with the second body, and a driving member to drive the first body or the second body such that the treatment space is open or closed. The sealing member is positioned in a sealing groove formed in the first body. The sealing member is moved toward the second body to be in close contact with the second body by pressure of the treatment space when a process is performed.

The sealing member may be provided in an annular ring shape. An inlet may be formed inside or in a bottom surface of the sealing member to introduce gas, and an introduction passage may be formed inside the sealing member while extending to the inlet. An upper end of the inlet may be positioned higher than an upper end of the introduction passage. A plurality of introduction passages may be provided and may be arranged in a circumferential direction of the sealing member.

According to an exemplary embodiment, an apparatus for treating a substrate includes a first body and a second body combined with each other to define a treatment space in which the substrate is treated, a substrate support unit to support the substrate in the treatment space, a fluid supply unit to supply a fluid to the substrate supported by the substrate support unit, a heating member to heat the treatment space such that a fluid supplied to the treatment space is heated to a critical temperature or more, a sealing member interposed between the first body and the second body to seal the treatment space from an outside at a position in which the first body is in close contact with the second body, and a driving member to drive the first body or the second body such that the treatment space is open or closed. The first body has a sealing groove formed in a contact surface with the second body and used for positioning the sealing member and an introduction hole extending from a bottom surface having the sealing groove to the treatment space. The sealing member is moved toward the second body to be in close contact with the second body by pressure applied to the treatment space and the introduction hole when a process is performed.

According to another exemplary embodiment, an apparatus for treating a substrate includes a first body and a second body combined with each other to define a treatment space in which the substrate is treated, a substrate support unit to support the substrate in the treatment space, a fluid supply unit to supply a fluid to the substrate supported by the substrate support unit, a heating member to heat the treatment space such that a fluid supplied to the treatment space is heated to a critical temperature or more, a sealing member interposed between the first body and the second body to seal the treatment space from an outside at a position in which the first body is in close contact with the second body, and a driving member to drive the first body or the second body such that the treatment space is open or closed. The sealing member has a first part positioned in a sealing groove formed in the first body and a second part protruding out of the sealing groove while extending from the first part to the second body. The first part is moved toward the second body inside the sealing groove by pressure of the treatment space such that the second part is in close contact with the second body when a process is performed.

A partial region of the sealing groove may have a width narrower than a width of another region of the sealing groove, and the sealing member may further include an intermediate part extending from the first part to the second part and positioned corresponding to the partial region.

The second body of each of the apparatus described above may be positioned at an upper portion of the first body. The driving member may include a cylinder to lift the first body or the second body.

One of the first body and the second body may be lifted, by the driving member, to have a closed position in which the treatment space is closed or an open position in which the treatment space is open. The apparatus may further include a clamping unit positioned at the closed position and having a clamp space into which a first side portion of the first body and a second side portion of the second body are simultaneously inserted. A vertical length of the clamp space may be longer than a sum of vertical lengths of the first side portion and the second side portion inserted into the clamp space.

The apparatus may further include a controller to control the driving member. The controller may control the lifting member to release the driving when side portions of the upper body and the lower body positioned at the closed position are inserted into the clamp space.

The apparatus further includes a buffer member installed in one of the first body and the second body except for the sealing groove to reduce an impulse between the upper body and the lower body.

The process is performed at an atmosphere having pressure higher than normal pressure.

The apparatus further include a fluid supply unit to supply a fluid to the treatment space, and the fluid is supplied in a supercritical state when the process is performed.

According to another exemplary embodiment, a method for treating the substrate using the device includes a substrate carrying step of carrying the substrate into the treatment space which is open, a closing step of moving one of the first body and the second body by applying driving force to the one of the first body and the second body such that the first body and the second body are in close contact with each other, a clamping step of simultaneously clamping a first side portion of the first body and a second side portion of the second body by a clamping unit, and a processing step of treating the substrate by supplying the fluid to the treatment space. The sealing member is in contact with the second body due to pressure of the treatment space, which is changed in the processing step, to seal a gap between the first body and the second body.

The method further includes a releasing step of releasing the driving force between the clamping step and the processing step. The releasing step may include forming a gap between the first side portion and the second side portion by the sealing member. A vertical length of a clamp space, in which the first side portion and the second side portion are clamped, in the clamping unit may be longer than a sum of vertical lengths of the first side portion and the second side portion inserted into the clamp space. The releasing step may allow the first body and the second body to be in close contact with the clamping unit.

The processing step may include forming pressure of the treatment space to be higher than normal pressure by the fluid supplied to the treatment space. In the processing step, the fluid may be in a supercritical state.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
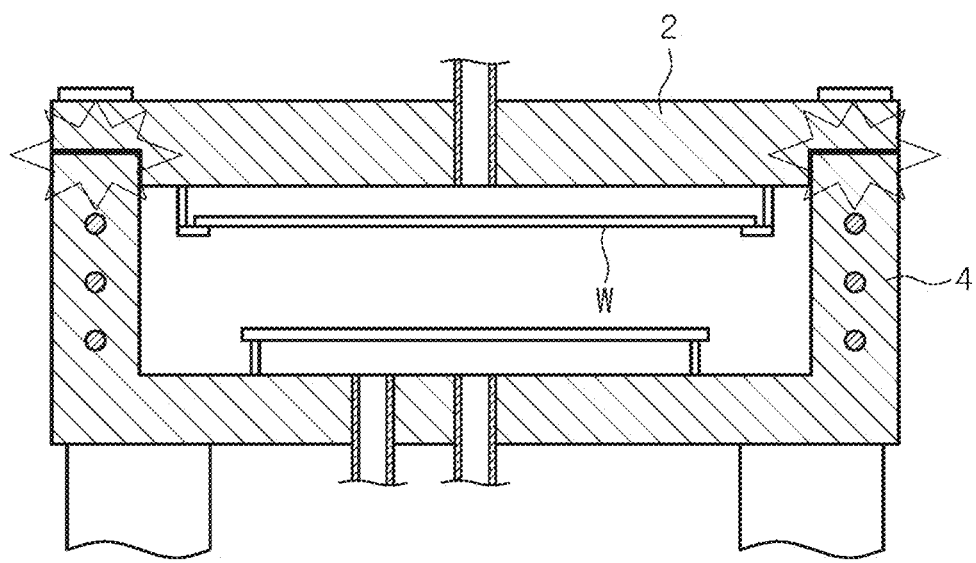
FIG. 1 is a sectional view illustrating an apparatus for sealing a treatment space using fluid pressure.

The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

Hereinafter, an embodiment of the inventive concept will be described with reference to FIGS. 2 to 21.

Figure 2:
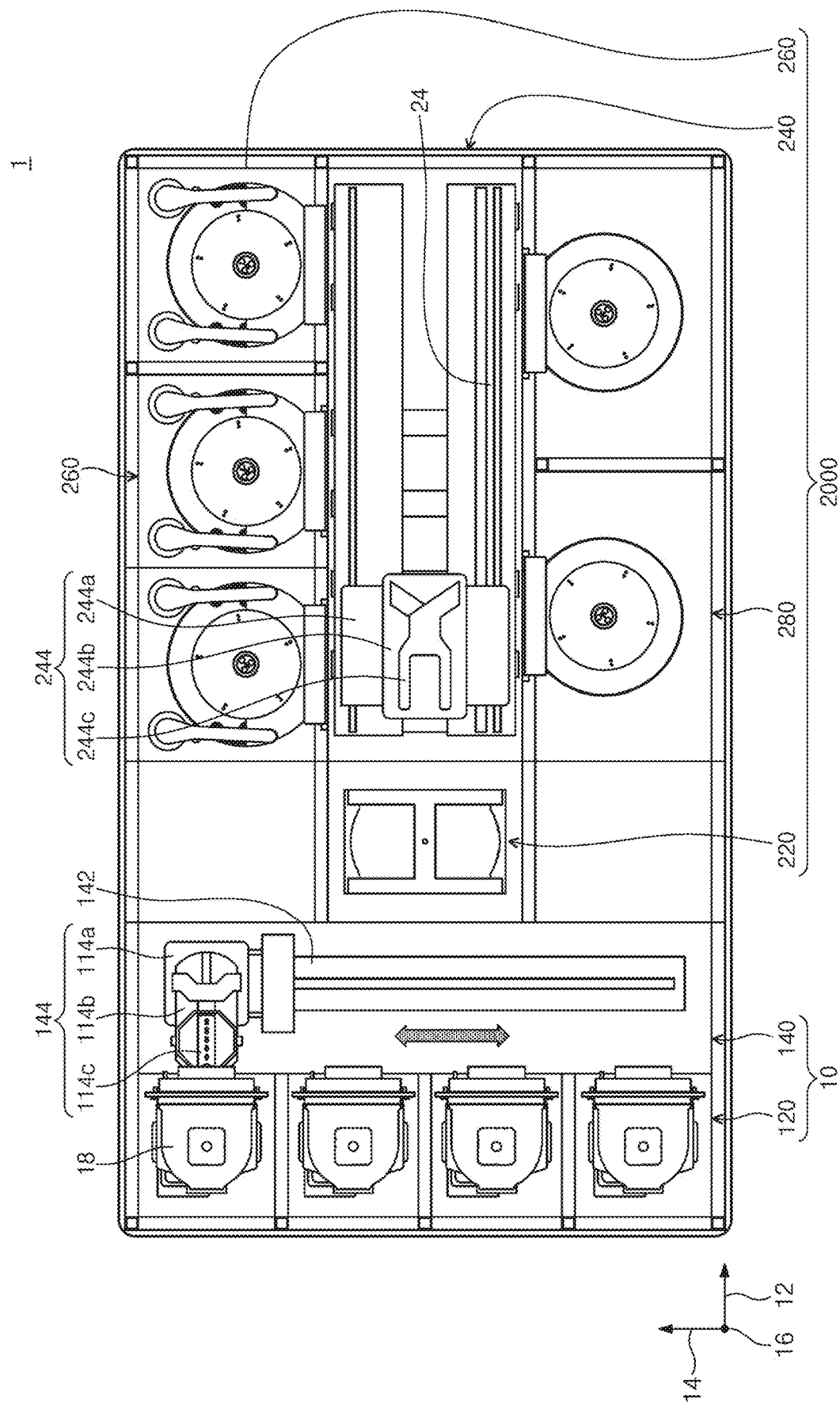
FIG. 2 is a plan view illustrating a substrate treating facility, according to a first embodiment of the inventive concept.

FIG. 2 is a plan view illustrating a substrate treating facility, according to an embodiment of the inventive concept.

Referring to FIG. 2, a substrate treating facility 1 has an index module 10 and a process treating module 20, and the index module 10 includes a load port 120 and a feeding frame 140. The load port 120, the feeding frame 140, and the process treating module 20 may be sequentially arranged in a row. Hereinafter, a direction in which the load port 120, the feeding frame 140, and the process treating module 2000 are arranged will be referred to as a first direction 12, a direction that is perpendicular to the first direction 12 when viewed from the top will be referred to as a second direction 14, and a direction that is normal to a plane containing the first direction 12 and the second direction 14 will be referred to as a third direction 16.

A carrier 18 having a substrate W received therein is seated on the load port 120. A plurality of load ports 120 are provided, and are arranged in the second direction 14 in a line. FIG. 1 illustrates that four load ports 120 are provided. However, the number of the load ports 120 may increase or decrease depending on a condition, such as the process efficiency of the process treating module 2000 or a footprint. A slot (not illustrated) is formed in the carrier 18 to support the edge of the substrate. A plurality of slots are provided in the third direction 16, and substrates are positioned in the carrier 18 such that the substrates are stacked in the third direction 16 while being spaced apart from each other. A front opening unified pod (FOUP) may be used as the carrier 18.

The process treating module 2000 includes a buffer unit 220, a carrying chamber 240, a first process unit 260, and a second process unit 280. The carrying chamber 240 is disposed such that the lengthwise direction thereof is in parallel to the first direction 12. First process unit s 260 are arranged at one side of the carrying chamber 240 in the second direction 14, and second process unit s 280 are arranged on an opposite side of the carrying chamber 240 in the second direction 14. The first process units 260 and the second process units 280 may be arranged to be symmetrical to each other about the carrying chamber 240. Some of the first process units 260 are arranged in the lengthwise direction of the carrying chamber 240. Furthermore, others of the first process units 260 are arranged to be stacked on each other. In other words, the first process units 260 may be arranged in the form of a matrix of A×B (A and B are natural numbers) at one side of the carrying chamber 240. Here, A is the number of the first process units 260 provided in a line in the first direction 12, and B is the number of the second process units 280 provided in a line in the third direction 16. When four or six first process unit s 260 are provided at one side of the carrying chamber 240, the first process units 260 may be arranged in 2×2 or 3×2. The number of the first process units 260 may increase or decrease. Similarly to the first process units 260, the second process units 280 may be arranged in the form of a matrix M×N (M and N are natural numbers). Here, M and N may be equal to A and B, respectively. Unlike the above description, the first process units 260 and the second process units 280 may be provided only on one side of the carrying chamber 240. Further, unlike the above description, the first process units 260 and the second process units 280 may be provided in a single layer at opposite sides of the carrying chamber 240. In addition, unlike the above description, the first process units 260 and the second process units 280 may be provided in various arrangements.

The buffer unit 220 is interposed between a feeding frame 140 and the carrying chamber 240. The buffer unit 220 provides a space in which the substrate W stays before the substrate is carried between the feeding chamber 240 and the feeding frame 140. The buffer unit 220 is provided therein with a slot (not illustrated) in which the substrate W is placed and a plurality of slots (not illustrated) are spaced apart from each other in the third direction 16. The buffer unit 220 is open in surfaces facing the feeding frame 140 and the carrying chamber 240. 19

The feeding frame 140 carries the substrate "W" between a carrier 18 seated in the load port 120 and the buffer unit 220. An index rail 142 and an index robot 144 are provided in the feeding frame 140. The index rail 142 is provided such that the lengthwise direction thereof is in parallel to the second direction 14. The index robot 144 is installed on the index rail 142 to be linearly moved in the second direction 14 along the index rail 142. The index robot 144 may contain a base 144a, a body 144b, and an index arm 144c. The base 144a may be installed to be movable along the index rail 142. The body 144b may be joined to the base 144a. The body 144b may be provided to be movable on the base 144a along the third direction 16. Furthermore, the body 144b may be provided to be rotatable on the base 144a. The index arm 144c may be joined to the body 144b such that the index arm 144c is movable forward and backward with respect to the body 144b. A plurality of index arms 144c may be provided, and may be driven independently of each other. The index arms 144c may be arranged to be stacked on each other under the condition that index arms 144c are spaced apart from each other along the third direction 16. Some of the index arms 114c are used when carrying the substrates "W" to the carrier 18 from the process treating module 2000, and some of the index arms 114c may be used when carrying the substrates W from the carrier 18 to the process treating module 2000. This structure may prevent particles, which are produced from the substrates "W" before the process treatment, from sticking to the substrates "W" after the process treatment in the process of introducing the substrates "W" in and out of by the index robot 144.

The carrying chamber 240 transfers the substrate W between any two of the buffer unit 220, the first process units 260, and the second process units 280. A guide rail 242 and a main robot 244 are provided in the carrying chamber 240. The guide rail 242 is disposed such that the lengthwise direction thereof is parallel to the first direction 12. The main robot 244 is installed on the guide rail 242 to move in the first direction 12 on the guide rail 242.

The first process unit 260 and the second process unit 280 may sequentially perform a process on one substrate W. For example, the substrate "W" may be subject to a chemical process, a rinsing process, and a first drying process, in the first process unit 260, and may be subject to a second drying process in the second process unit 280. In this case, the first drying process may be performed by using an organic solvent and the second drying process may be performed by using a supercritical fluid. An isopropyl alcohol (IPA) liquid may be used as the organic solvent, and carbon dioxide ($CO_2$) may be used as the supercritical fluid. Unlike this, the first drying process may be omitted from the first process unit 260.

Figure 3:
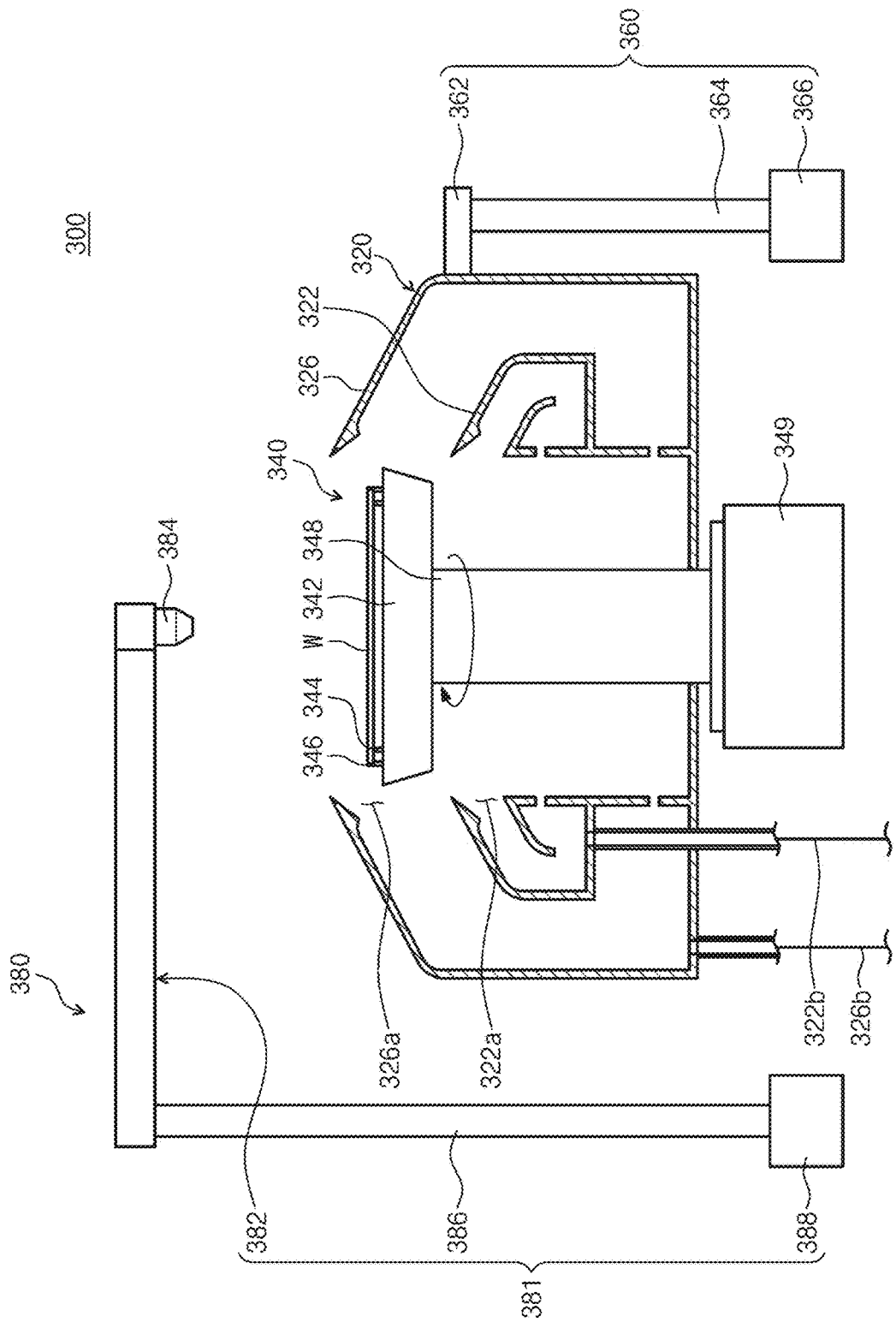
FIG. 3 is a sectional view illustrating an apparatus for cleaning the substrate in the first process unit of FIG. 2.

Hereinafter, a substrate treatment device 300 provided in the process unit 260 will be described. FIG. 3 is a sectional view illustrating an apparatus for cleaning the substrate in the first process unit of FIG. 2. Referring to FIG. 3, the substrate treatment device 300 may include a treatment container 320, a spin head 340, a lifting unit 360, and a liquid supplying unit 380. The treatment container 320 may provide a space that the substrate treating process is performed and an upper portion of the treatment container 320 may be open. The treatment container 320 has an inner recovery vessel 322 and an outer recovery vessel 326. The recovery vessels 322 and 326 recover mutually different treatment liquids used in the process. The inner recovery vessel 322 is provided to have an annular ring shape that surrounds the spin head 340, and the outer recovery vessel 326 is provided to have an annular ring shape that surrounds the inner recovery vessel 322. An inner space 322*a* of the inner recovery vessel 322 and a space 326*a* between the outer recovery vessel 326 and the inner recovery vessel 322 function as inlets for introducing the treatment liquids into the inner recovery vessel 322 and the outer recovery vessel 326, respectively. Recovery lines 322*b* and 326*b* are connected to the recovery vessels 322 and 326 while vertically extending downward from the bottom surface the recovery vessels 322 and 326. The recovery lines 322*b* and 326*b* are to discharge the treatment liquids introduced into the recovery vessels 322 and 326, respectively. The discharged treatment liquids may be recycled through an external treatment liquid recycling system (not illustrated).

The spin head 340 is arranged in the treatment container 320. The spin head 340 rotates the substrate "W" while supporting the substrate "W" during the process. The spin head 340 has a body 342, a support pin 344, a chuck pin 346, and a support shaft 348. The body 342 has a top surface provided in a substantially circular shape when viewed from the top. The support shaft 348 is fixedly coupled to the bottom surface of the body 342 to be rotatable by a motor 349. A plurality of support pins 344 are provided. The support pins 344 may be arranged to be spaced apart from each other at an edge part of the top surface of the body 342 while protruding upward from the body 342. The support pins 344 are arranged to substantially have an annular ring shape through combination thereof. The support pins 344 support an edge of a bottom surface of the substrate "W" such that the substrate "W" is spaced apart from the top surface of the body 342 by a specific distance. A plurality of chuck pins 346 are provided. The chuck pins 346 may be disposed to be farther away from the center of the body 342 than the support pins 344. The chuck pins 346 are provided to protrude upward from the body 342. The chuck pins 346 support side portions of the substrate "W" such that the substrate "W" does not laterally deviate from a right position thereof when the spin head 340 rotates. The chuck pins 346 are provided to be straightly movable between a standby position and a support position in a radial direction of the body 342. The standby position is farther apart from the center of the body 342 than the support position. When the substrate W is loaded onto on or unloaded from the spin head 340, the chuck pins 346 are positioned at the standby position. When a process is performed with respect to the substrate W, the chuck pins 346 are positioned at the support position. The chuck pins 346 are in contact with the side portions of the substrate "W" at the support position.

The lifting unit 360 linearly moves the treatment container 320 upward and downward. As the treatment container 320 moves upward and downward, a relative height of the treatment container 320 to the spin head 340 is changed. The lifting unit 360 has a bracket 362, a movable shaft 364, and a driver 366. The bracket 362 is fixedly installed on an outer wall of the treatment container 320, and the movable shaft 364 is fixedly coupled to the bracket 362 to move upward and downward by the driver 366 When the substrate "W" is placed on the spin head 340 or lifted from the spin head 340, the treatment container 320 moves downward such that the spin head 340 protrudes upward from the treatment container 320. The height of the treatment container 320 is adjusted such that the treatment liquid is introduced into the recovery vessel preset depending on the type of the treatment liquid supplied to the substrate "W" when the process is performed.

Alternatively, the lifting unit 360 may move the spin head 340 upward and downward instead of the treatment container 320.

The liquid supplying unit 380 may supply the treatment liquid on the substrate W. The liquid supplying unit 380 has a nozzle support 382, a nozzle 384, a support shaft 386, and a driver 388. The support shaft 386 is provided with a lengthwise direction which is the third direction 16, and the driver 388 is coupled to a lower end of the support shaft 386. The driver 388 rotates and lifts the support shaft 386. The nozzle support 382 is coupled to an end of the support shaft 386, which is opposite to an end of the support shaft 386 coupled to the driver 388, perpendicularly to the support shaft 386. The nozzle 384 is installed on the bottom surface of the end portion of the nozzle support 382. The nozzle 384 is moved between a process position and a standby position by the driver 388. The process position is a position at which the nozzle 384 is arranged at the vertical upper portion of the treatment container 320, and the standby position is a position that is out of the vertical upper portion of the treatment container 320. One or more liquid supplying unit 380 may be provided. When a plurality of liquid supplying units 380 are provided, the chemicals, the rinsing liquid, and the organic solvent may be provided through mutually different liquid supplying units 380. The chemicals may be a liquid having a strong acid or alkali property. The rinsing liquid may be pure water. The organic solvent may be a mixture of vapor of isopropyl alcohol (IPA) and an inert gas or an isopropyl alcohol (IPA) liquid.

Figure 4:
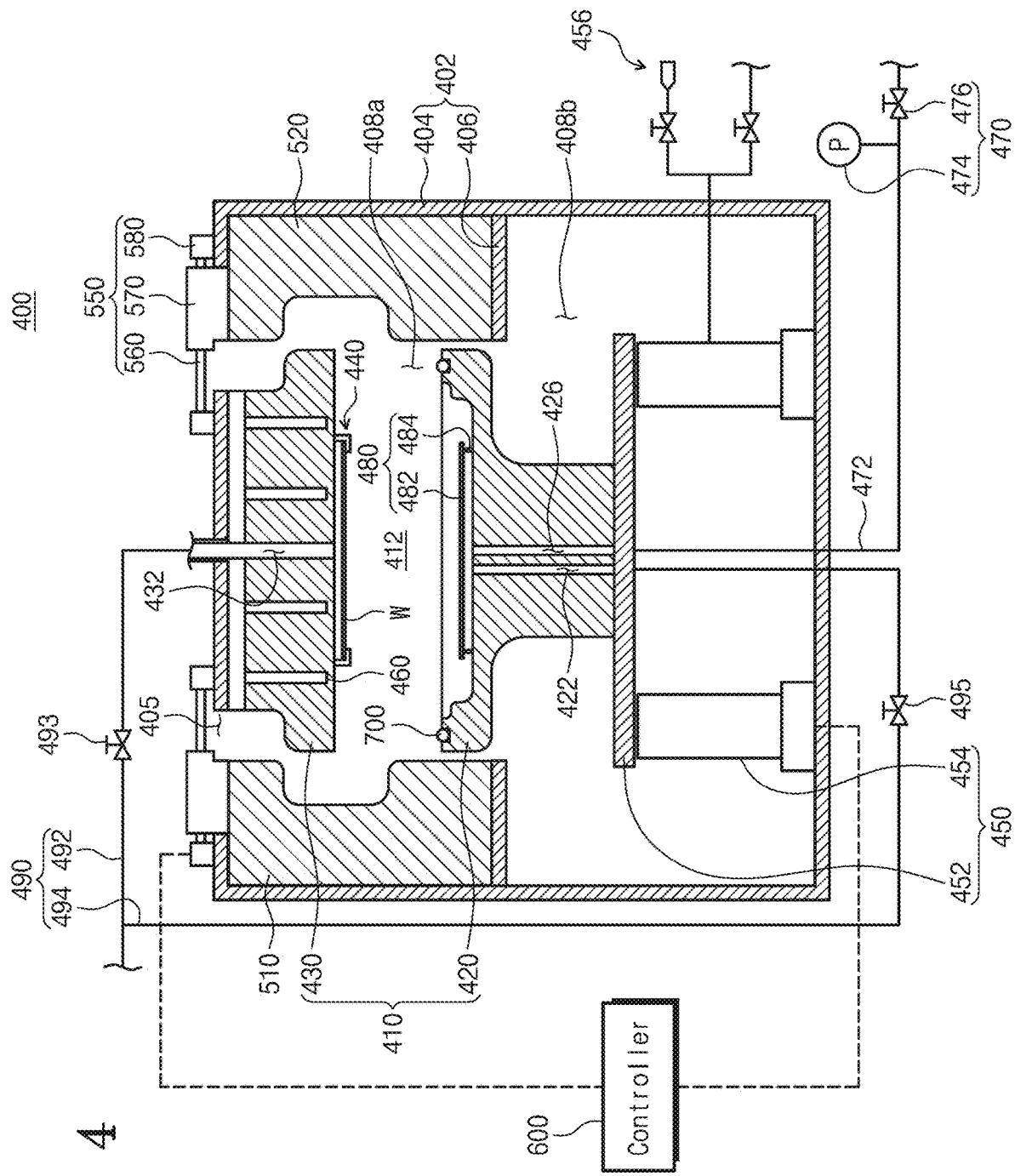
FIG. 4 is a sectional view illustrating an apparatus for cleaning the substrate in the second process unit of FIG. 2.
Figure 5:
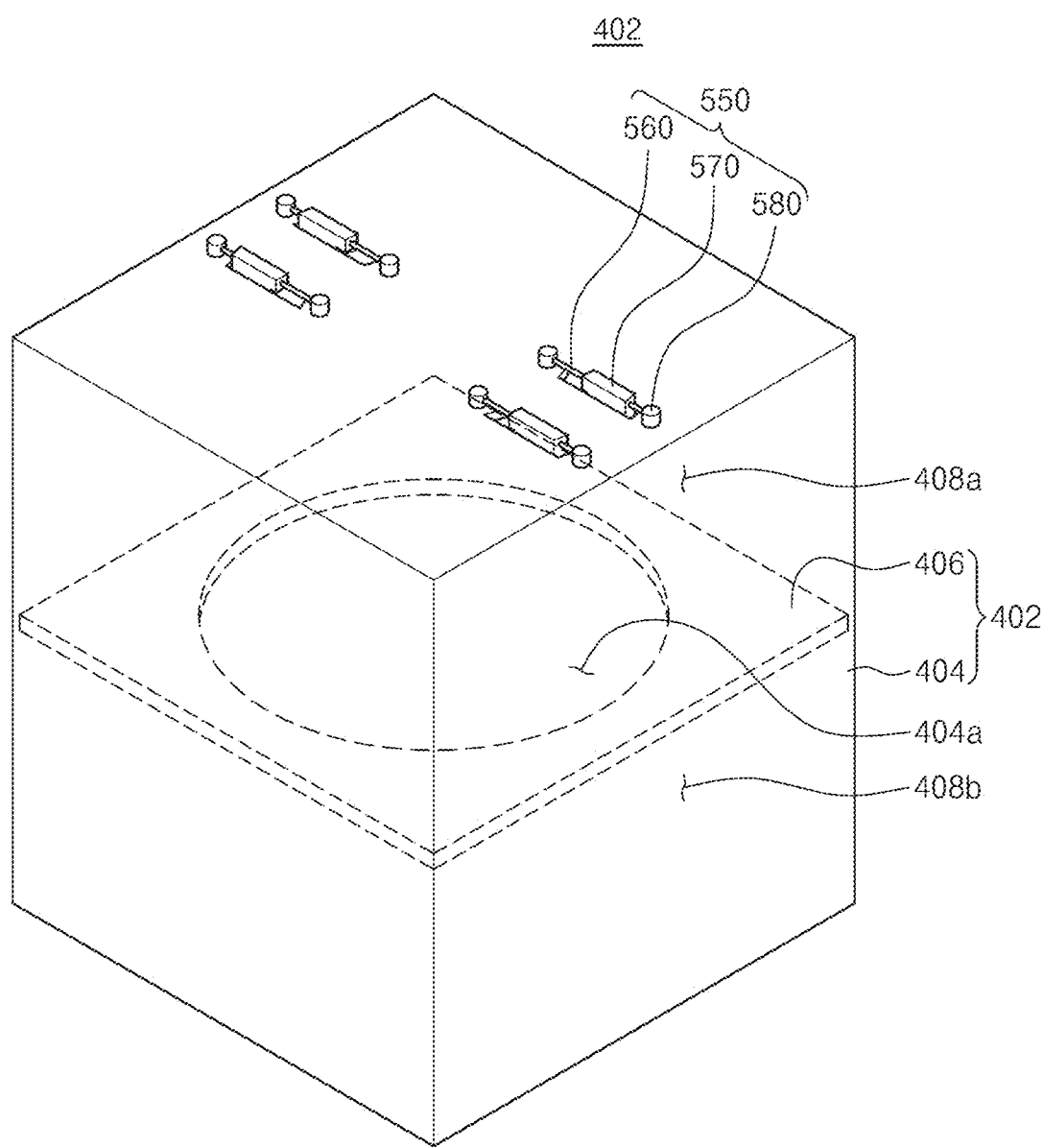
FIG. 5 is a perspective view illustrating a housing of FIG. 4.

A substrate treatment device 400 that performs the secondary drying process for the substrate "W" is provided in the second process unit 280. The substrate treatment device 400 performs the secondary drying process for the substrate W which is subject to the primary drying process in the first process unit 260. The substrate treatment device 400 dries the substrate "W" having remaining organic solvent. The substrate treatment device 400 may dry the substrate W by using a supercritical fluid. FIG. 4 is a sectional view illustrating an apparatus for drying a substrate in the second process unit of FIG. 2. FIG. 5 is a perspective view illustrating a housing of FIG. 4. Referring to FIGS. 4 and 5, the substrate treatment device 400 includes a housing 402, a process chamber 410, a substrate support unit 440, a lifting member 450, a heating member 460, a blocking member 480, an exhaust unit 470, a fluid supply unit 490, a clamping member 500, a moving member 550, a sealing member 700, a buffer member 800, and a controller 600.

The housing 402 includes a body 404 and an intermediate plate 406. The body 404 is provided in the shape of a tub having a receiving space therein. For example, the body 404 may be provided in a rectangular parallelepiped shape. The body 404 is provided in a top surface thereof with through holes 405 having a slit shape. The through holes 405 are provided to have the same longitudinal direction at mutually different positions. According to an embodiment, four through holes 405 may be provided, any two of the four through holes 405 may be positioned at one side, and remaining two through holes 405 may be positioned at an opposite side. Alternatively, the through holes 405 may be provided in even number. Two, six, or more through holes 405 may be provided. The through hole 405 serves as a passage to connect the moving member 550 with the clamping member 500.

The intermediate plate 406 is positioned inside the body 404. The intermediate plate 406 divides the receiving space 408 into an upper space 408a and a lower space 408b. The intermediate plate 406 is provided in the shape of a plate having a hollow 404a. The hollow 404a is provided such that the lower body 420 is inserted. The hollow 404a may be provided to have a diameter greater than that of a lower end of the lower body 420. The process chamber 410 and the clamping member 500 may be positioned in the upper space 408a and the lifting member 450 may be positioned in the lower space 408b. The moving member 550 may be positioned on the outer wall of the housing 402.

The process chamber 410 is provided therein with a treatment space 412 for treating the substrate W. The process chamber 410 seals the treatment space 412 from the outside during the treatment of the substrate W. The process chamber 410 includes a first body 420 and a second body 430. The first body 420 and the second body 430 are coupled to each other to form the treatment space in which the substrate is treated. The first body 420 and the second body 430 are placed to face each other in the vertical direction. According to the present embodiment, the first body 420 is defined as a lower body 420 positioned lower than the second body 430, and the second body 430 is defined as an upper body 430 positioned higher than the lower body 420.

The bottom surface of the lower body 420 is stepped. The lower body 420 is provided in a shape that the central bottom surface of the lower body 420 is lower than an edge part of the lower body 420. For example, the lower body 420 may be provided in a substantially cylindrical shape. The lower body 420 is able to be lifted between the upper space 408a and the lower space 408b of the body 404 by the lifting member 450. A lower supplying port 422 and an exhaust port 426 are formed in the bottom surface of the lower body 420. When viewed from the top, the lower supplying port 422 may be positioned to deviate from the central axis of the lower body 420. The lower supplying port 422 serves as a passage for supplying the supercritical fluid to the treatment space 412.

The upper body 430 is combined with the lower body 420 to form the treatment space 412 in the treatment space 412. The upper body 430 is positioned on the lower body 420. The upper body 430 is positioned in the upper space 408a of the housing 402. The side end portion of the upper body 430 is stepped. The upper body 430 is provided to have a shape that the central portion of the top surface is positioned higher than the edge portion of the top surface. For example, the lower body 430 may be provided in a substantially cylindrical shape. An upper supplying port 432 is formed in the upper body 430. The upper supplying port 432 serves a fluid passage for supplying the supercritical fluid to the treatment space 412. The upper supplying port 432 may be positioned to coincide with the center of the upper body 430. According to an embodiment, the upper body 430 and the lower body 420 may be formed of a metal material.

Figure 6:
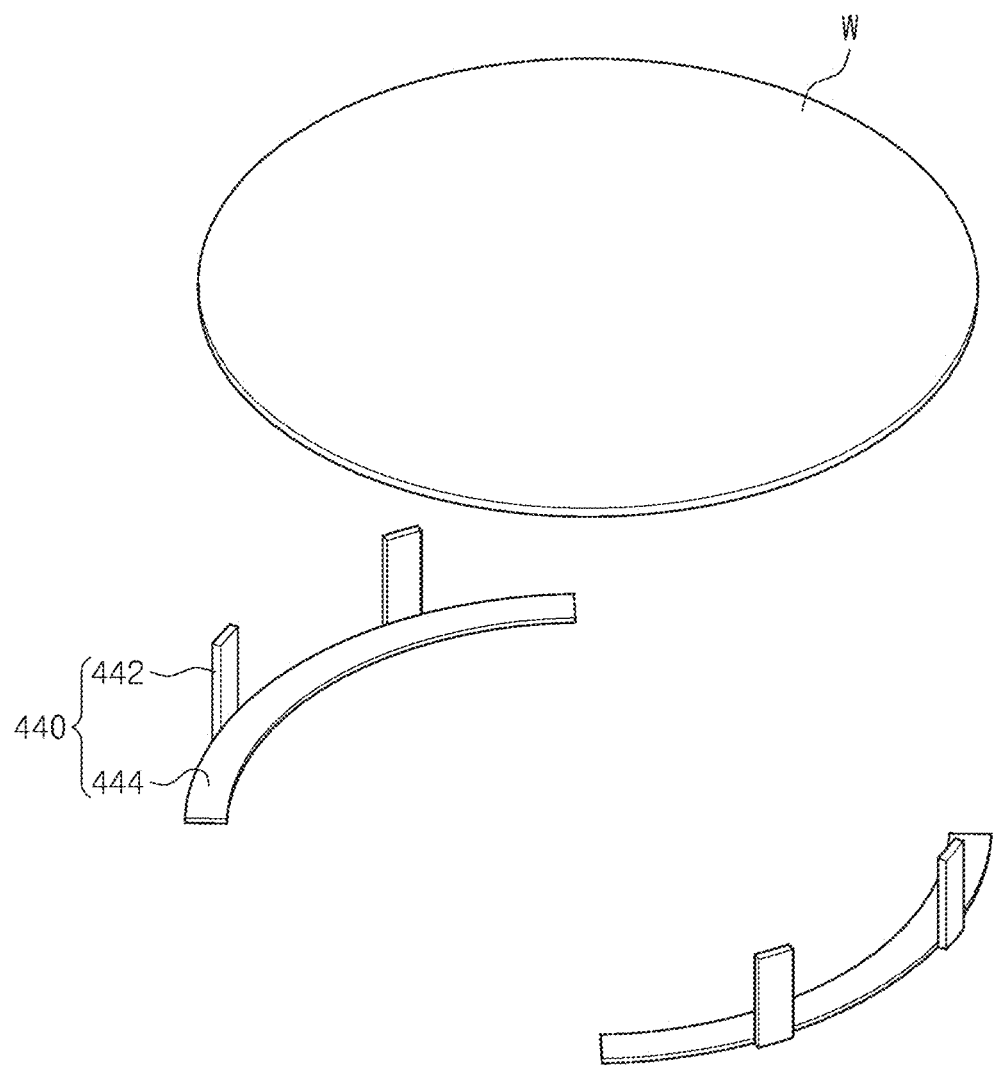
FIG. 6 is a perspective view illustrating the substrate support unit of FIG. 4.

The substrate support unit 440 supports the substrate "W" in the treatment space 412. FIG. 6 is a perspective view illustrating the substrate support unit of FIG. 4. Referring to FIG. 6, the substrate support unit 440 supports the substrate "W" such that the treatment surface of the substrate "W" faces up. The substrate support unit 440 includes a support member 442 and a substrate sustaining member 444. The support member 442 is provided in the shape of a bar extending downward from the bottom surface of the upper body 430. A plurality of support members 442 are provided. For example, four support members 442 may be provided. The substrate sustaining member 444 may support an edge region of a bottom surface of the substrate W. A plurality of substrate sustaining members 444 are provided and support mutually different regions of the substrate W. For example, two substrate sustaining members 444 may be provided. When viewed from the top, the substrate sustaining member 444 is provided in a rounded-plate shape. When viewed from the top, the substrate sustaining member 444 is positioned inside the support member 442. The substrate sustaining members 444 are combined with each other to have a ring shape. The substrate sustaining members 444 are positioned while being spaced apart from each other.

Referring to FIGS. 4 and 5 again, the lifting member 450 adjusts the relative position between the upper body 430 and the lower body 420. The lifting member 450 moves up and down any one of the upper body 430 and the lower body 420 such that the one of the upper body 430 and the lower body 420 is separated from or make close contact with a remaining one. The lifting member 450 is provided as a driving member 450 to move up and down any one of the upper body 430 and the lower body 420 such that the process chamber 410 is moved to an open position or a closed position. In this case, the open position is a position that the upper body 430 and the lower body 420 are spaced apart from each other, and the closed position is a position that contact surfaces of the upper body 430 and the lower body 420, which face each other, make close contact with each other. In other words, the open position is a position that the treatment space 412 is open from the outside, and the treatment space 412 is closed at the closed position. The present embodiment has been described in that the lifting member 450 moves up and down the lower body 420 in the lower space 408b and the position of the upper body 430 is fixed. Alternatively, the lower body 420 may be fixed, and the upper body 430 may be moved up and down with respect to the lower body 420. In this case, the lifting member 450 may be positioned in the upper space 408a.

The lifting member 450 includes a support plate 452, a lifting shaft 454, and a driver 456. The support plate 452 supports the lower body 420 in the lower space 408b. The lower body 420 is fixedly coupled to the support plate 452. The support plate 452 is provided in the shape of a circular plate. The support plate 452 is provided to have a diameter greater than a diameter of the hollow 404a. Accordingly, the lower end of the lower body 420 is positioned in the lower space 408b even at the closed position. The lifting shaft 454 supports the bottom surface of the support plate 452 in the lower space 408b. The lifting shaft 454 is fixedly coupled to the support plate 452. A plurality of lifting shafts 454 are provided. Lifting shafts 454 are positioned to be arranged in a circumferential direction. The driver 456 moves up and down the lifting shafts 454. A plurality of drivers 456 are provided and coupled to the lifting shafts 454 in one-to-one correspondence. When driving force is applied to the driver 456, the lower body 420 and the lifting shaft 454 are lifted, and the upper body 430 and the lower body 420 are moved to the closed position that the treatment space is sealed. When the side portions of the lower body 420 and the upper body 430 are clamped by a clamping member at the closed position, the driving force of the driver 456 is released and the upper body 430 and the lower body 420 may be maintained at the closed position. The driving force is identically applied to the drivers 456 and identically released from the drivers 456. Accordingly, the lifting shafts 454 are positioned at the same height in moving up or down, and the support plate 452 and the lower body 420 are moved up or down while being maintained level. For example, the driver 456 may be a cylinder.

The heating member 460 heats the treatment space 412. The heating member 460 heats the supercritical fluid supplied to the treatment space 12 to a critical temperature or more such that the supercritical fluid is maintained in a supercritical fluid phase. The heating member 460 includes a plurality of heaters 460. The heaters 460 are provided in the shape of bars or rods extending in parallel to each other. The heaters 460 have lengthwise directions perpendicular to the direction that the clamps 510 and 520 are moved. For example, the heaters 460 have lengthwise directions parallel to the direction that the bodies 420 and 430 are moved. This is because it is difficult to insert the heater 460 from a lateral side of each of the bodies 420 and 430 since the side portion of each of the bodies 420 and 430 is clamped. The heater 460 may be buried in a wall of at least one of the upper body 430 and the lower body 420. For example, the heater 460 may receive power from the outside and may emit heat. Although the present embodiment has been described in that the heater 460 is provided in the upper body 430, the heaters 460 may be provided in the upper body 430 and the lower body 420. In addition, the heater 460 may be provided only in the lower body 420.

The blocking member 480 blocks the supercritical fluid, which is supplied through the lower supplying port 474, from directly being supplied to a non-treatment surface of the substrate "W". The blocking member 480 includes a blocking plate 482 and a support 484. The blocking plate 482 is interposed between the lower supplying port 474 and the substrate support unit 440. The blocking plate 482 is provided to have a circular plate shape. The blocking plate 482 has a diameter smaller than an inner diameter of the lower body 420. When viewed from the top, the blocking plate 482 has a diameter to cover all the lower supplying port 474 and the discharge port 426. For example, the blocking plate 482 may be provided to have a diameter equal to or greater than a diameter of the substrate "W". The support 484 supports the blocking plate 482. A plurality of supports 484 are provided and arranged in a circumferential direction of the blocking plate 482. The supports 484 may be arranged to be spaced apart from each other by a uniform distance.

The exhaust unit 470 exhausts air from the treatment space 412. The process by-product produced in the treatment space 412 is exhausted through the exhaust unit 470. The air may be naturally or forcibly exhausted. In addition, the exhaust unit 470 may adjust the pressure of the treatment space 412 while exhausting the process by-product. The exhaust unit 470 includes an exhaust line 472 and a pressure measuring member 474. The exhaust line 472 is connected with the exhaust port 426. An exhaust valve 476 mounted on the exhaust line 472 is able to adjust an amount of exhaust air in the treatment space 412. The pressure measuring member 474 is mounted on the exhaust line 472 to measure the pressure of the exhaust line 472. The pressure measuring member 474 is positioned upstream from the exhaust valve 476 in an air exhaust direction. The pressure of the treatment space 412 is reduced by the exhaust unit 470 to normal pressure or pressure corresponding to the external pressure of the process chamber 410.

The fluid supplying line 490 supplies a treatment fluid to the treatment space 412. The treatment space 412 is supplied in a supercritical state by a supercritical temperature and a supercritical pressure. The fluid supplying line 490 includes an upper supplying line 492 and a lower supplying line 494. The upper supplying line 492 is connected to the upper supplying port 432. The treatment fluid is supplied to the treatment space 412 sequentially via the upper supplying line 492 and the upper supplying port 432. An upper valve 493 is mounted on the upper supplying line 492. The upper valve 493 opens and closes the upper supplying line 492. The lower supplying line 494 connects the upper supplying line 492 with the lower supplying port 422. The lower supplying line 494 branches from the upper supplying line 492 and is connected to the lower supplying port 422. That is, the treatment fluids supplied through the upper supplying line 492 and the lower supplying line 494 may be the same type of fluids. The treatment fluid is supplied to the treatment space 412 sequentially via the lower supplying line 494 and the lower supplying port 422. A lower valve 495 is mounted on the lower supplying line 494. The upper valve 495 opens and closes the upper supplying line 494.

According to an embodiment, a treatment fluid may be supplied through the lower supplying port 422 facing a non-treatment surface of the substrate W, and then may be supplied from the upper supplying port 432 facing a treatment surface of the substrate W. Accordingly, the treatment fluid may be supplied to the treatment space 412 through the lower supplying line 494, and then may be supplied to the treatment space 412 through the upper supplying line 492. This is because the treatment fluid supplied at the initial stage may be prevented from being supplied to the substrate W without reaching the critical pressure or the critical temperature.

The clamping member 500 clamps the upper body 430 and the lower body 420 positioned at the closed position. Accordingly, even if the internal pressure of the treatment space is increased when the process is performed, the gap may be prevented from being formed between the upper body 430 and the lower body 420. In addition, the driving force of the driver 456 is released while the process chamber 410 is clamped by the clamping member 500. Accordingly, strong force is applied to the driver 456 for a long time and the driver 456 may be prevented from being damaged.

Figure 7:
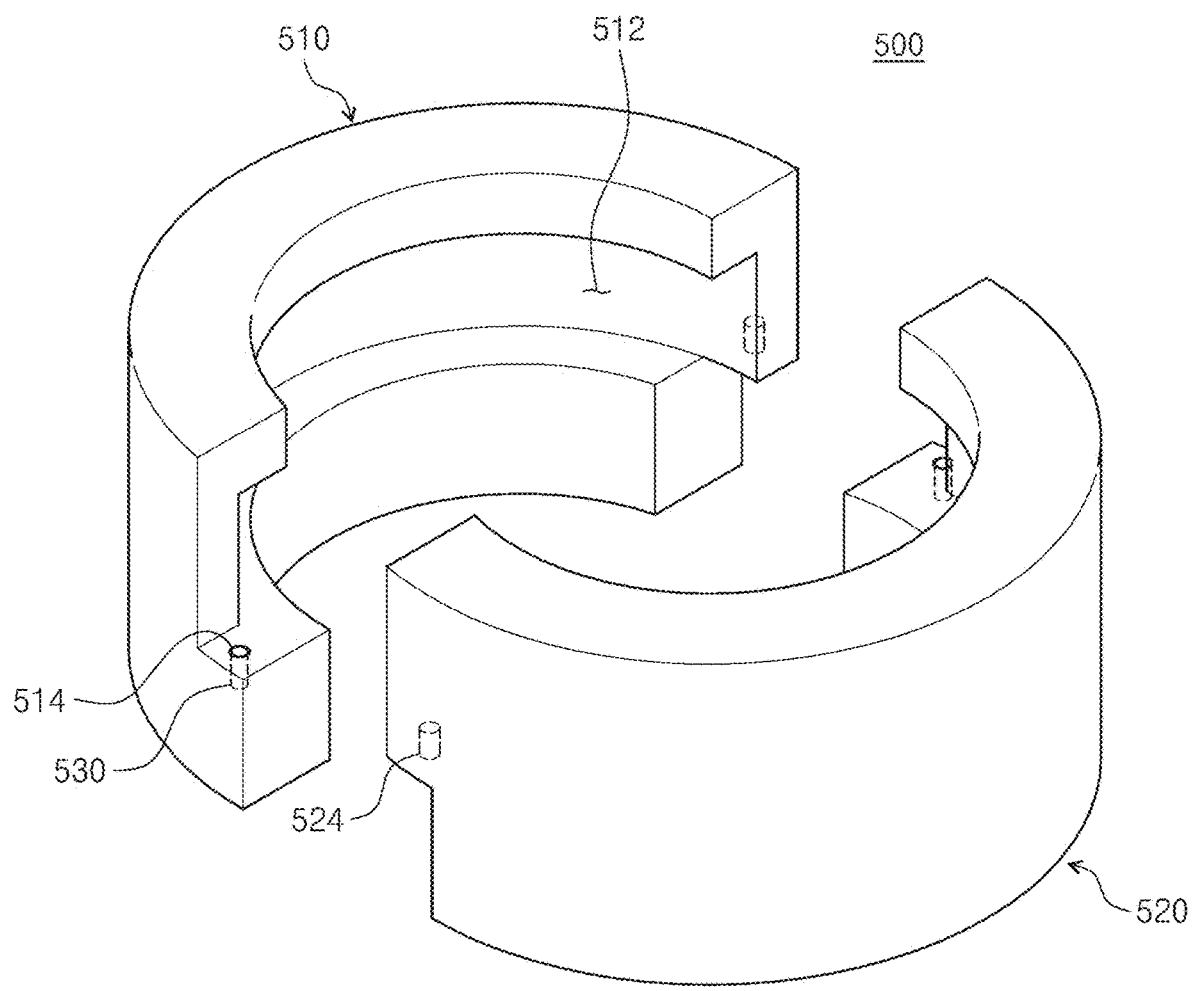
FIG. 7 is a perspective view illustrating the clamping member of FIG. 4.

FIG. 7 is a perspective view illustrating the clamping member of FIG. 4. Referring to FIG. 7, the clamping member 500 includes a first clamp 510, a second clamp 520, and a locking pin 530. The first clamp 510 and the second clamp 520 are positioned at side portions of the process chamber 410. According to an embodiment, the first clamp 510 and the second clamp 520 are positioned to face each other while interposing the process chamber 410 therebetween. The first clamp 510 and the second clamp 520 are provided to surround the process chamber 410. The first clamp 510 and the second clamp 520 have clamp spaces 512 formed in inner surfaces facing the process chamber 410. The side portion of the lower body 420 and the side portion of the upper body 430, which are positioned at the closed position, are inserted into the clamp space 512. In other words, the first side portion of the lower body 420 and the second side portion of the upper body 430 are provided as regions to be clamped. The vertical length of the clamp space 512 is longer than the sum of the vertical length of the first side portion of the lower body 420 and the vertical length of the second side portion of the upper body 430. The sum of the vertical length of the first side portion and the vertical length of the second side portion are shorter than the vertical length of the clamp space 512.

The clamping member 500 may be movable to a locking position or a releasing position. In this case, the locking position is a position at which the upper body 430 and the lower body 420 are clamped as the first clamp 510 and the second clamp 520 are closer to each other. The unlocking position is defined as a position at which the first clamp 510 and the second clamp 520 are spaced apart from the upper body 430 and the lower body 420. The first clamp 510 and the second clamp 520 are assembled with each other at the locking position to have an annular ring shape. For example, the vertical sectional surface of any one of the first clamp 510 and the second clamp 520 has a "C" shape or a substantially C shape. The vertical sectional surface of a remaining one of the first clamp 510 and the second clamp 520 may be provided symmetrically to the vertical sectional surface of the any one of the first clamp 510 and the second clamp 520 about a vertical axis.

The first clamp 510 is provided to be stepped in one side surface thereof making contact with the second clamp 520. The second clamp 520 is provided to be stepped in another side surface making contact with the first clamp 510. One surface of the first clamp 510 and another surface of the second clamp 520 are provided to be offset to each other. According to an embodiment, in one surface of the first clamp 510, an upper end has a step longer than a step of a lower end. In an opposite surface of the second clamp 520, an upper end has a step shorter than a step of a lower end. The stepped region of the first clamp 510 is formed therein with a first pin groove 514 in which the locking pin 530 is positioned, and the stepped region of the second clamp 520 is formed therein with a second pin groove 524. Each of the first pin groove 514 and the second pin groove 524 is provided in a direction perpendicular to a moving direction of the clamping member 500. The first pin groove 514 and the second pin groove 524 are positioned in opposition to each other at the locking position. According to an embodiment, the locking pin 530 may protrude from the first pin groove 514 and may be inserted into the second pin groove 524 at the locking position. In addition, the first pin groove 514 is additionally formed in the second clamp 520 and the second pin groove 524 is additionally formed in the first clamp 510.

Referring to FIGS. 4 and 5, the moving member 550 moves the clamping member 500 to the locking position and the releasing position. The moving member 550 moves the clamping member 500 in a direction perpendicular to the moving direction of the process chamber 410. The moving member 550 includes a guide rail 560, a bracket 570, and a driving member 580. The guide rail 560 is positioned outside the housing 402. The guide rail 560 is positioned to be adjacent to the upper space 408a in which the upper body 430 is positioned. The guide rail 560 is mounted on the top surface of the housing 402. The guide rail 560 has a lengthwise direction perpendicular to the moving direction of the process chamber 410. A plurality of guide rails 560 are provided and have the same lengthwise direction. According to an embodiment, the number of the guide rails 560 is the same as the number of the through holes 405. The guide rails 560 have lengthwise directions parallel to the through holes 405. When viewed from the top, the guide rail 560 is overlapped with the through hole 405. The bracket 570 fixedly couples the guide rail 560 to the clamping member 500. The numbers of the bracket 570 is equal to the number of guide rails 560. According to an embodiment, when viewed from the top, the first clamp 510 is coupled to the guide rail 560 positioned at one side, and the second clamp 520 may be coupled to a guide rail positioned at an opposite side. The driving member 580 drives the guide rail 560 such that the clamping member 500 is moved to a locking position or an unlocking position in a lengthwise direction of the guide rail 560.

Figure 8:
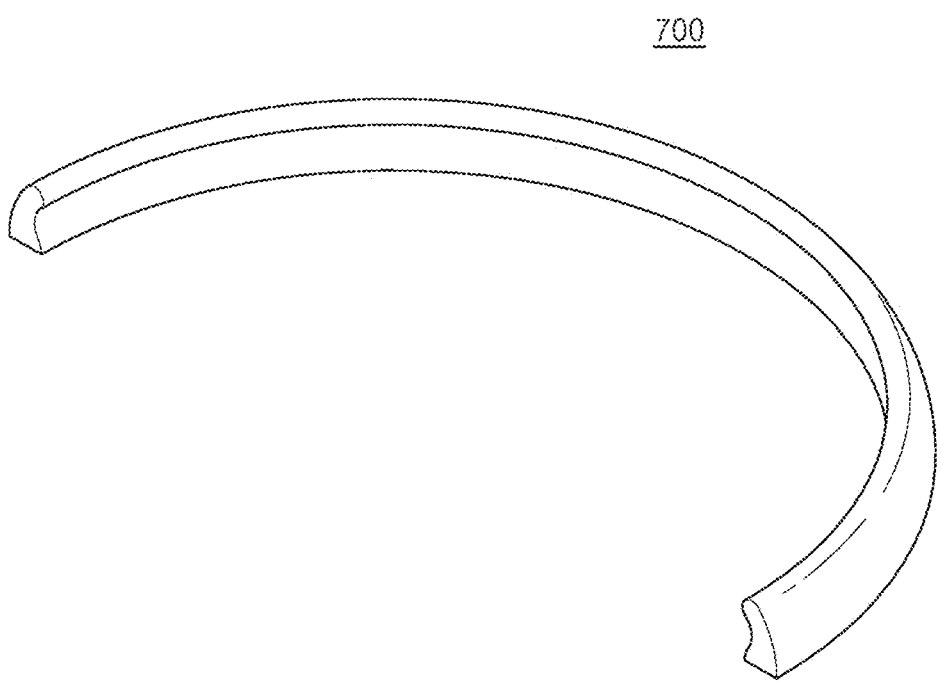
FIG. 8 is a cut-out perspective view illustrating the sealing member of FIG. 4.
Figure 9:
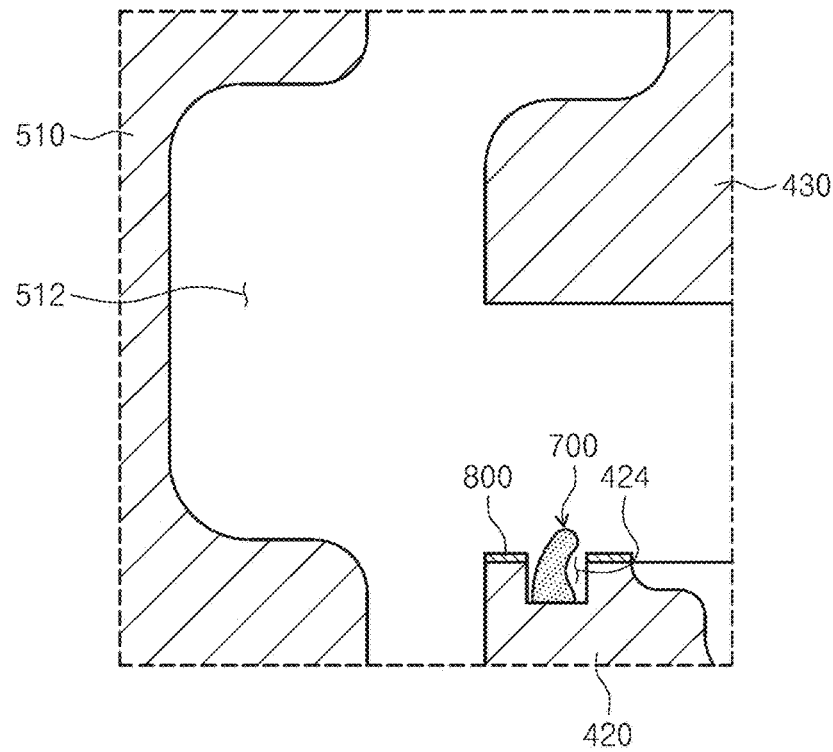
FIGS. 9 to 13 are views illustrating a procedure of sealing the treatment space by the sealing member of FIG. 8.
Figure 10:
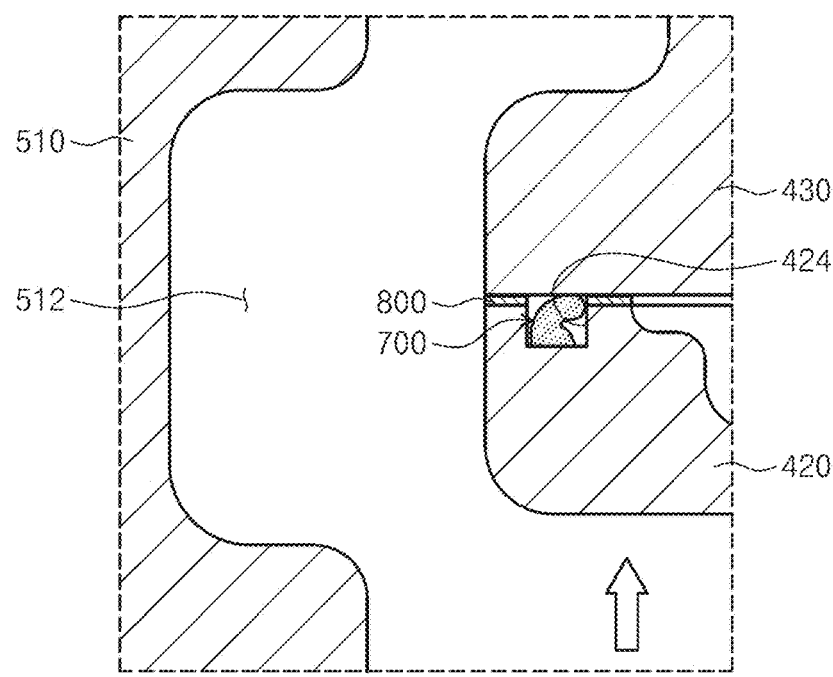
Figure 11:
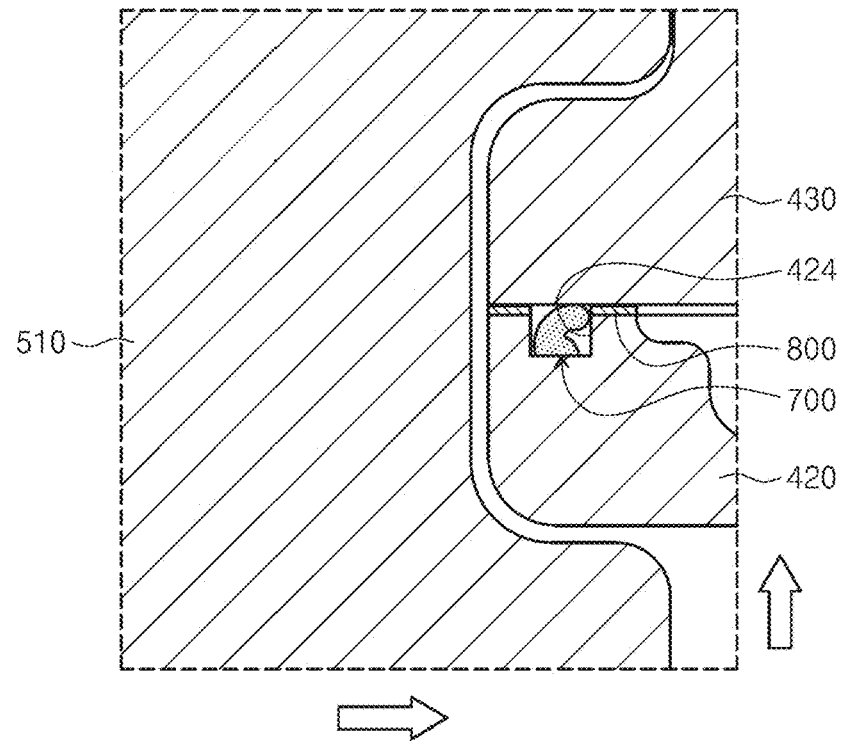
Figure 12:
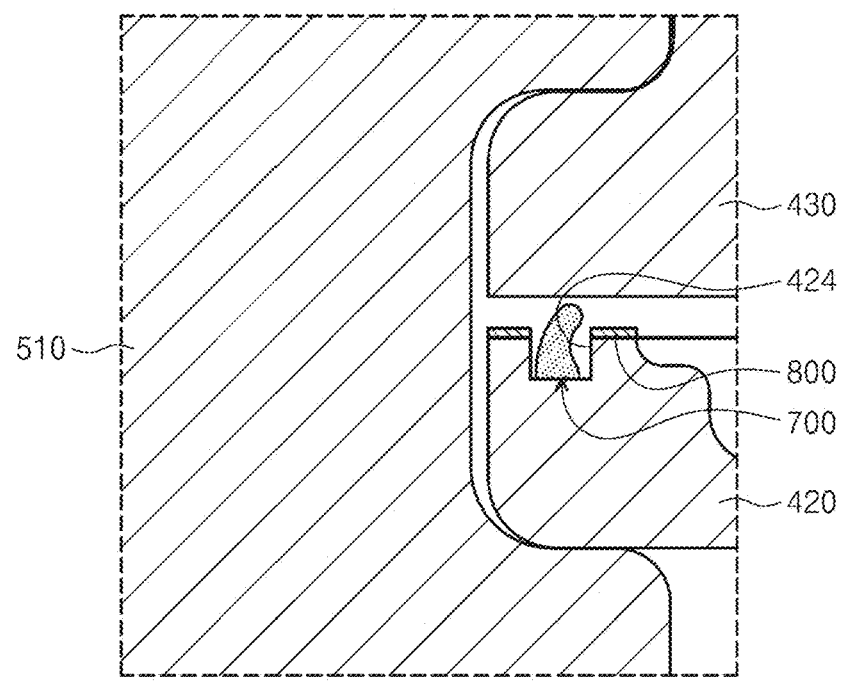
Figure 13:
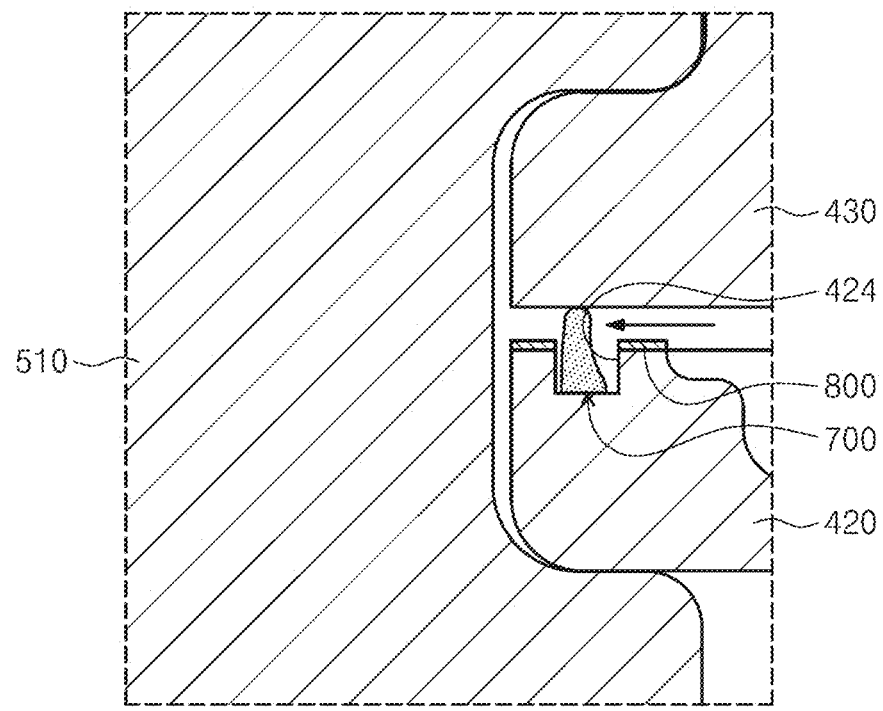

The sealing member 700 seals the gap between the upper body 430 and the lower body 420 positioned at the closed position. FIG. 8 is a cut-out perspective view illustrating the sealing member of FIG. 4. Referring to FIG. 8, the sealing member 700 is interposed between the upper body 430 and the lower body 420 to seal the treatment space 412 from the outside. The sealing member 700 has an annular ring shape. For example, the sealing member 700 may be provided in the form of an O-ring 700. The sealing member 700 is positioned in a sealing groove 424. The sealing groove 424 is formed in the close contact surface between the lower body 420 and the upper body 430. The sealing groove 424 is formed in the bottom surface of the upper body 430 or the top surface of the lower body 420. When viewed from the top, the sealing groove 424 is provided to have an annular ring shape. The present embodiment has been described in that the sealing groove 424 is provided in the top surface of the lower body 420. A portion of the sealing member 700 is inserted into the sealing groove 424 and another portion of the sealing member 700 protrudes from the sealing groove 424. The sealing member 700 may be formed of a material having elasticity.

The sealing member 700 is provided in an annular ring shape that is able to be inserted into the sealing groove 424. The sealing member 700 is deformed by pressure of the treatment space 412. When the treatment space 412 has pressure higher than normal pressure, that is, has a critical pressure, the sealing member 700 may be deformed such that an end portion of the sealing member 700 is moved. An end of the sealing member 700 is provided as a free end. According to an embodiment, an end of the sealing member 700 may include an upper end. In the sealing member 700, a width of a lower region may be greater than a width of an upper region. The sealing member 700 has a shape rounded in a direction of approaching the central axis of the sealing member 700 toward the end of the sealing member 700 from the lower end of the sealing member 700. When the treatment space 412 is provided at pressure higher than the normal pressure, the end of the sealing member 700 is moved in a direction of being apart from the central axis to make close contact with the upper body 430. Accordingly, the gap between the upper body 430 and the lower body 420 is sealed. In this case, the lower end of the sealing member 700 is fixedly coupled to the lower body 420.

The buffer member 800 reduces the impulse between the upper body 430 and the lower body 420. The buffer member 800 is installed in the contact region between the upper body 430 and the lower body 420. According to an embodiment, the buffer member 800 may be provided on the top surface of the lower body 420 except for the sealing groove 424. The buffer member 800 may be provided in the form of a film including a resin material.

The controller 600 controls the lifting member 450 and the moving member 550. The controller 600 controls the lifting member 450 such that the process chamber 410 moves to the closed position or the open position and controls the moving member 550 such that the clamping member 500 is moved to the locking position or the unlocking position According to an embodiment, the controller 600 may perform a control operation such that the clamping member 500 is moved to the locking position from the unlocking position when the process chamber 410 is moved from the open position to the closed position. The controller 600 may control the lifting member 450 to release the driving force of the driver 456 when the process chamber 410 is closed by the clamping member 500.

Figure 14:
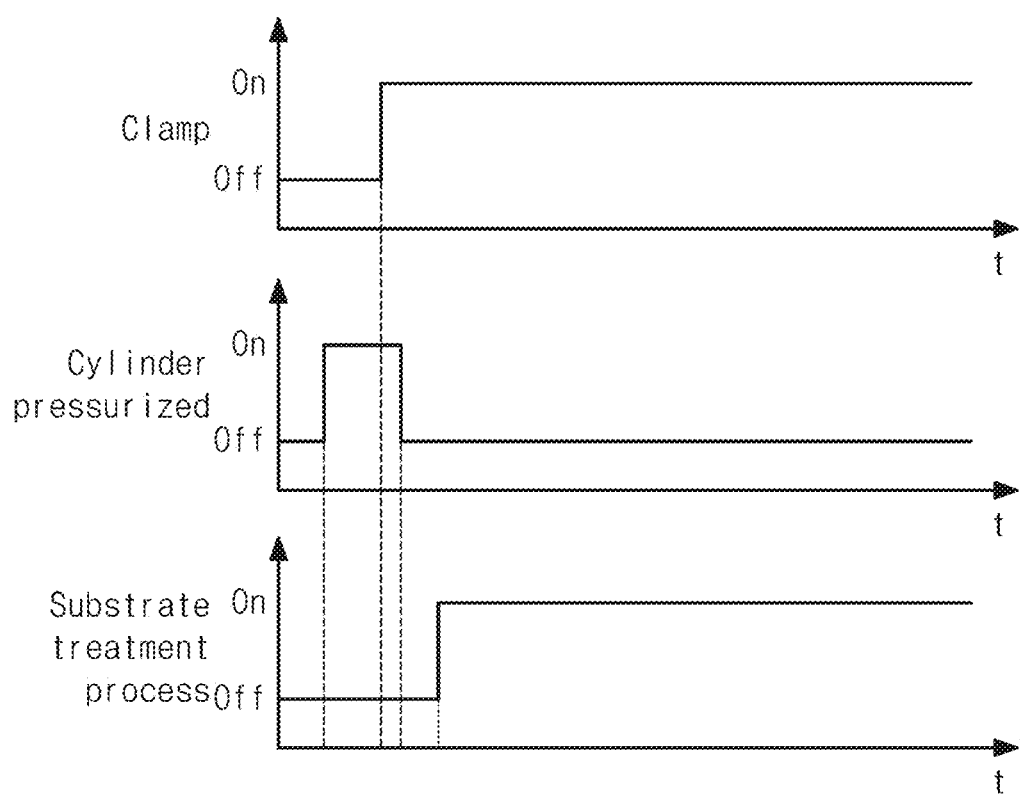
FIG. 14 illustrates graphs representing the relationship among the lifting member, the clamping member, and the substrate treating process during the procedure of treating the substrate in FIGS. 9 to 13.

Hereinafter, description will be made with respect to the procedure of sealing the treatment space 412 before treating the substrate W by using the substrate treatment device 400. FIGS. 9 to 13 are views illustrating the procedure of sealing the treatment space 412 by the sealing member 700 of FIG. 8, and FIG. 14 illustrates graphs representing the relationship among the lifting member, the clamping member, and the substrate treating process during the procedure of treating the substrate in FIGS. 9 to 13.

Referring to FIGS. 9 to 14, the method for treating the substrate includes a substrate carrying step, a closing step, a clamping step, an unlocking step, and a process step.

In the substrate carrying step, the substrate is carried into the treatment space 412 by a main robot 244. The process chamber 410 is positioned at an open position. The main robot 244 transfers the substrate W to the substrate support unit 440. When the substrate carrying step is finished, the closing step is performed.

In the closing step, the process chamber 410 is moved from the open position to the closed position. In other words, the lower body 420 is lifted and moved to be in close contact with the upper body 430. In the closing step, the upper body 430 and the lower body 420 may be in close contact with each other, and the sealing member 700 may be in close contact with the upper body 430. When the closing step is finished, the clamping step is performed.

In the clamping step, the clamping member 500 is moved from the unlocking position to the locking position. Accordingly, the first side portion of the lower body 420 and the second side portion of the upper body 430 are inserted into the clamp space 512. In this case, the driving force provided from the lifting member is maintained in the lower body 420. Since the vertical length of the clamp space 512 is longer than the sum of the vertical length of the first side portion and the vertical length of the second side portion, the gap between the clamping member and the first side portion and the gap between the clamping member and the second side portion are made. Accordingly, the clamping member 500 minimizes the friction between the first side portion and the second side portion when the clamping member is moved to the locking position. Accordingly, particles may be blocked. When the clapping step is finished, the unlocking step is performed.

In the unlocking step, the driving force applied to the lower body 420 by the lifting member 450 is released. Accordingly, each of the first side portion and the second side portion is in close contact with the clamp member 500, and the gap between the upper body 430 and the lower body 420 is made. When the unlocking step is finished, the process step is performed.

In the process step, the treatment fluid is supplied to the treatment space 412 through the lower supplying port 422 and the treatment space 412 reaches a critical temperature and critical pressure. When the treatment space 412 reaches the critical temperature and the critical pressure, the supply of the treatment fluid through the lower supplying port 422 is stopped and the supply of the treatment fluid through the upper supplying port 432 is performed. The treatment space 412 is pressurized by the treatment fluid to have an atmosphere having pressure higher than the normal pressure. The free end of the sealing member 700 is deformed due to the high pressure of the treatment space 412 to be in close contact with the upper body 430 Accordingly, the sealing member 700 seals the gap between the upper body 430 and the lower body 420.

Figure 15:
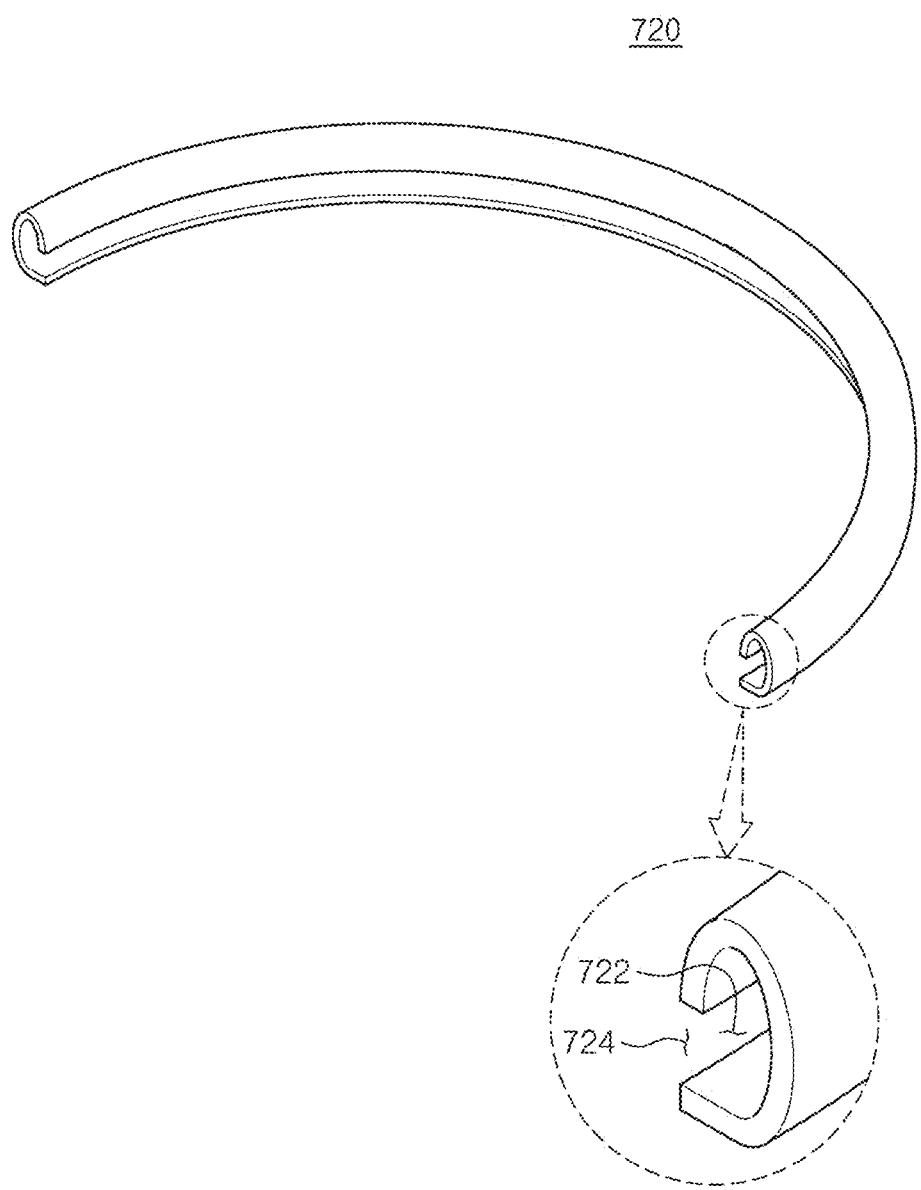
FIG. 15 is a cut-off perspective view illustrating the sealing member of FIG. 8 according to the second embodiment.
Figure 16:
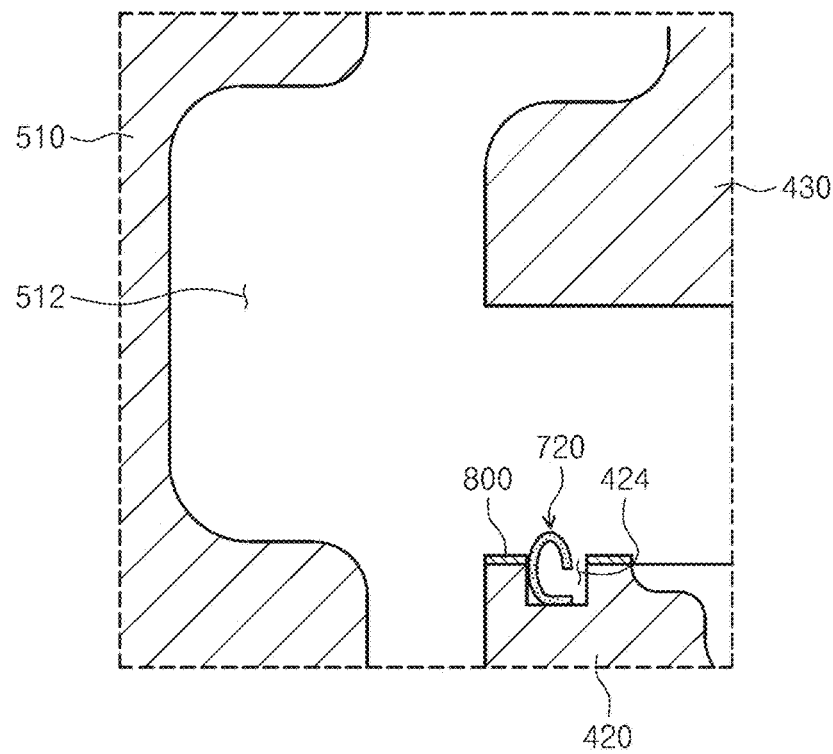
FIGS. 16 to 20 are views illustrating the procedure of sealing the treatment space by the sealing member of FIG. 15.
Figure 17:
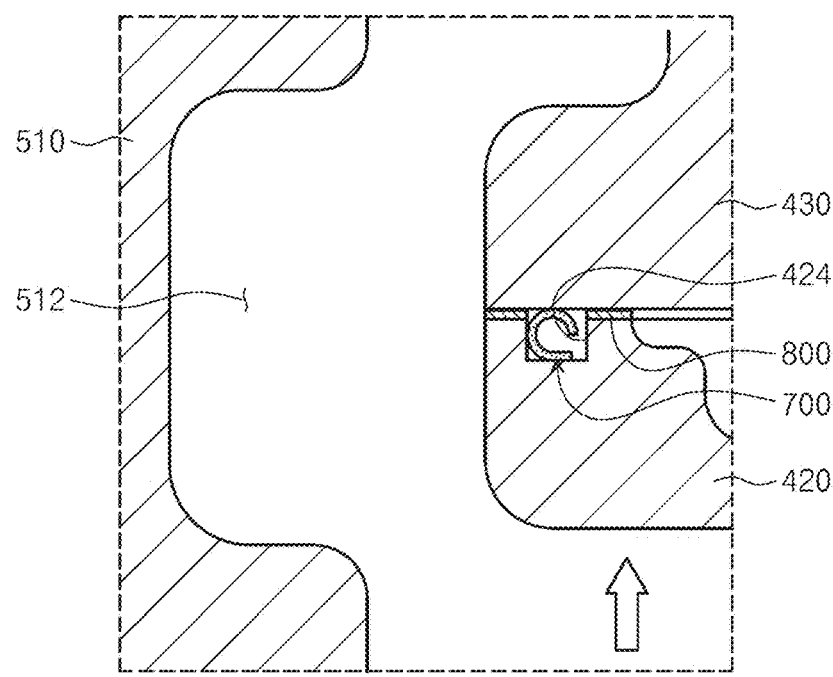
Figure 18:
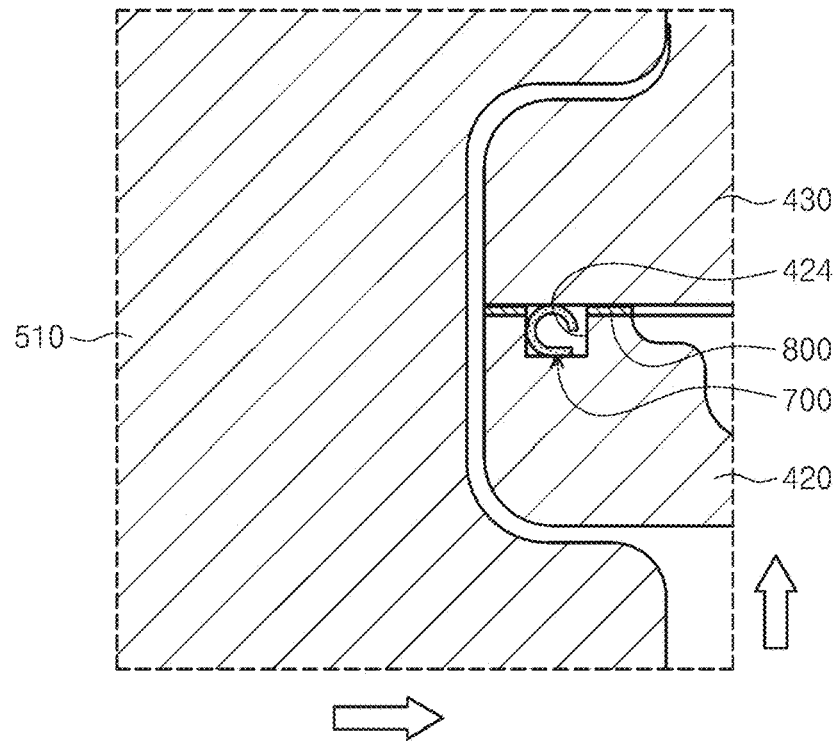
Figure 19:
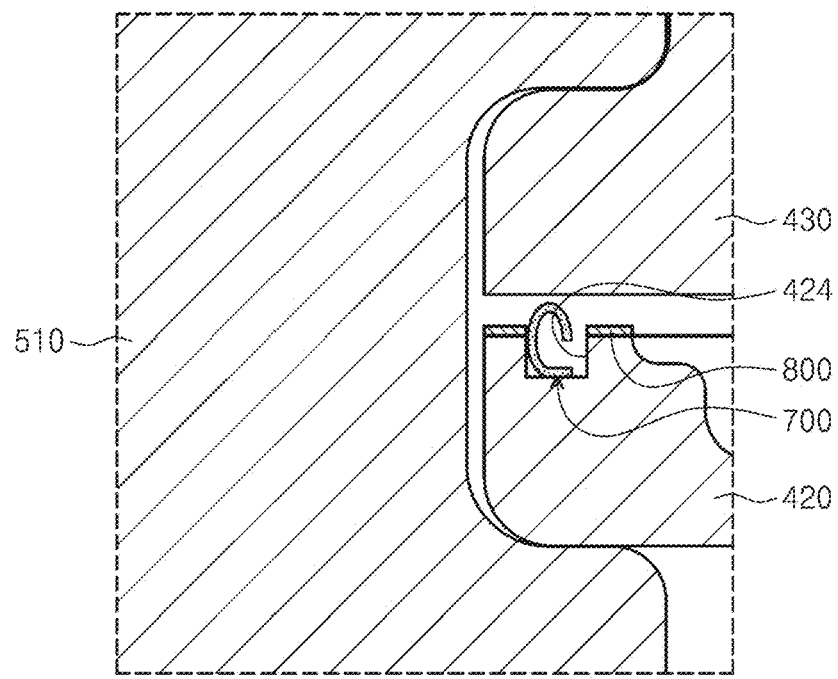
Figure 20:
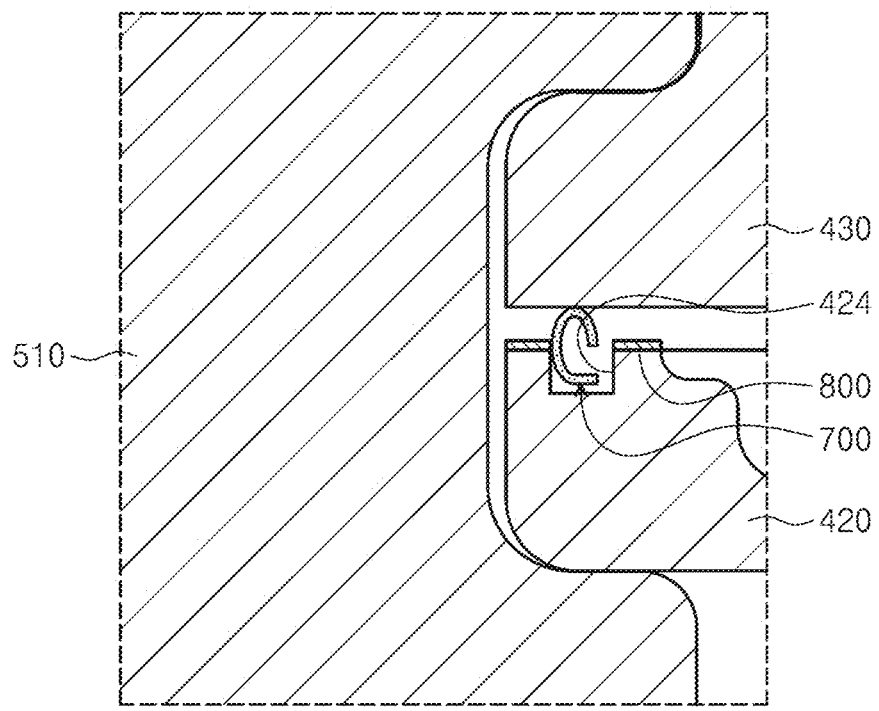

Hereinafter, the second embodiment of the sealing member 700 will be described. FIG. 15 is a cut-off perspective view illustrating the sealing member of FIG. 8 according to the second embodiment. FIGS. 16 to 20 are views illustrating the procedure of sealing the treatment space by the sealing member of FIG. 15. Referring to FIGS. 15 to 20, the position of the sealing member 720 may be moved by the pressure of the treatment space 412 such that the sealing member 720 is in close contact with the upper body 430. The sealing member 720 may be provided in the form of an annular ring shape. An inlet 722 may be formed inside the sealing member 720. An introduction passage 724 may be formed inside the sealing member 720 while extending to the inlet 722. The upper end of the inlet 722 may be positioned higher than the upper end of the introduction passage 724. A plurality of introduction passages 724 may be provided and may be arranged in a circumferential direction of the sealing member 720. Accordingly, a portion of a fluid supplied to the treatment space 412 may be introduced into the inlet 722 through the introduction passage 724, and the sealing member 720 is moved from the lower body 420 to the upper body 430 to seal the gap between the upper body 430 and the lower body 420. For example, the sealing member 720 may be lifted.

Figure 21:
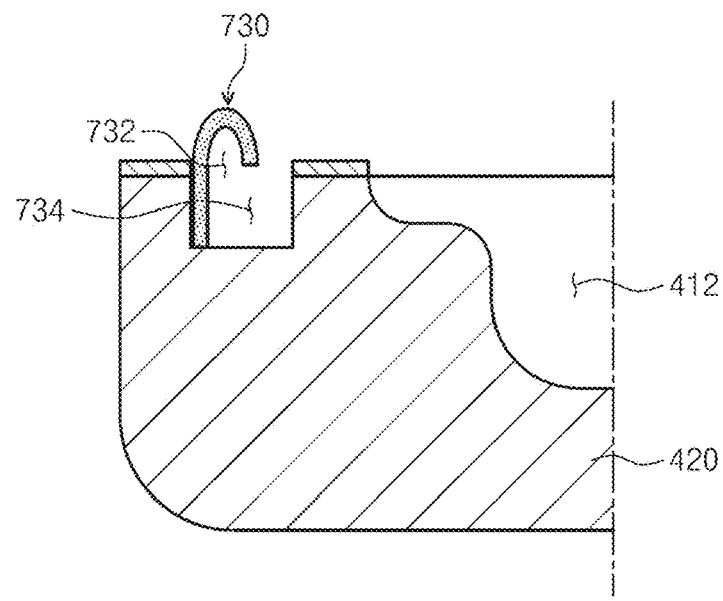
FIG. 21 is a sectional view illustrating the sealing member of FIG. 8, according to a third embodiment.

Hereinafter, the sealing member 730 will be described according to the third embodiment. FIG. 21 is a sectional view illustrating the sealing member of FIG. 8, according to a third embodiment. Referring to FIG. 21, an inlet 732 may be formed inside the sealing member 730, and an introduction passage 734 may be provided in the bottom surface and in the inner surface of the sealing member 730 while extending to the inlet 732. Accordingly, the sealing member 730 of FIG. 21 is moved from the lower body 420 to the upper body 430 by the pressure of the treatment space 412 similarly to the sealing member 720 of FIG. 15 to seal the gap between the upper body 430 and the lower body 420.

Figure 22:
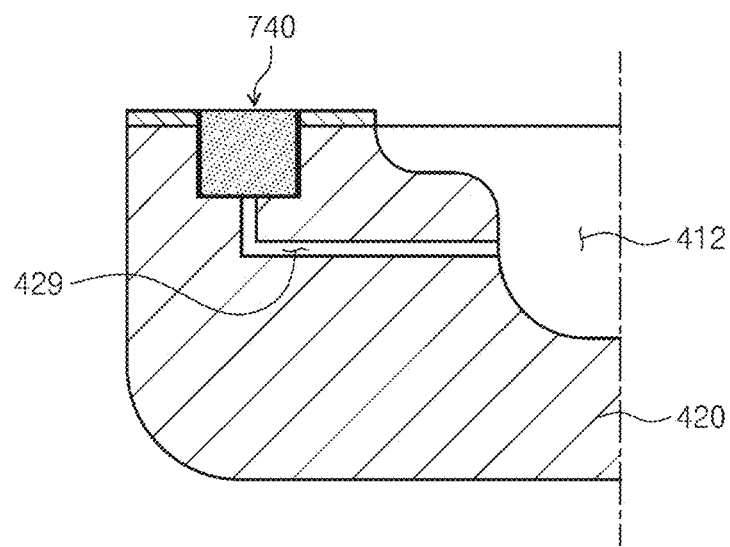
FIG. 22 is a sectional view illustrating the sealing member of FIG. 8, according to a fourth embodiment.

Hereinafter, the sealing member 740 will be described according to the fourth embodiment. FIG. 22 is a sectional view illustrating the sealing member of FIG. 8, according to a fourth embodiment. Referring to FIG. 22, an introduction hole 429 may be formed under a sealing groove 424 to communicate with the treatment space 412. The introduction hole 429 may be provided upward. Accordingly, a portion of the treatment fluid supplied to the treatment space 412 may be provided toward the bottom surface of the sealing member 740 through the introduction hole 429. Accordingly, the sealing member 740 is moved toward the upper body 430 from the lower body 420 by the pressure of the treatment space 412 to seal the gap between the upper body 430 and the lower body 420.

Figure 23:
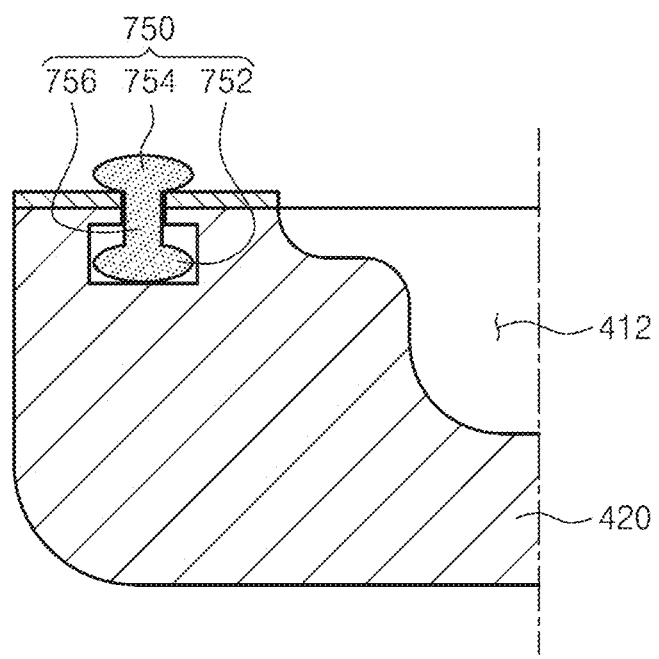
FIG. 23 is a sectional view illustrating the sealing member of FIG. 8, according to a fifth embodiment.

Hereinafter, the sealing member 750 will be described according to the fifth embodiment. FIG. 23 is a sectional view illustrating the sealing member of FIG. 8, according to a fifth embodiment. Referring to FIG. 23, the sealing member 750 may have a first part 752, a second part 754, and an intermediate part 756. In this case, the first part 752 is a portion of the sealing member 700 positioned inside the sealing groove 424, and the second part 754 may be a portion of the sealing member 700 protruding from the sealing groove 424. The intermediate part 756 may be a part linking the first part 752 with the second part 754. A protrusion may be formed at the upper region of the sealing groove 424. Accordingly, in the sealing groove 424, the width of the upper region may be narrower than the width of the lower region. The intermediate part 756 may have the width narrower than the width of the first part 752 and the width of the second part 754. The intermediate part 756 of the sealing member 750 may be positioned corresponding to the protrusion. Accordingly, the protrusion may serve as a stopper function of the sealing member 750. The protrusion may prevent the sealing member 750 from deviating from the sealing groove 424 by the pressure of the treatment space 412.

According to an embodiment of the inventive concept, the sealing member is deformed by pressure of the treatment space to seal the gap between the upper body and the lower body. Accordingly, the treatment space may be sealed from the outside without causing the damage to the sealing member in the process of sealing the treatment space.

According to an embodiment of the inventive concept, the sealing member is moved by the pressure of the treatment space to seal the gap between the upper body and the lower body. Accordingly, the treatment space may be sealed from the outside without causing the damage to the sealing member in the process of sealing the treatment space.

In addition, according to an embodiment of the inventive concept, the sealing of the treatment space is maintained by a clamp. Accordingly, since the driving member such as the cylinder does not need to be used for a long time so as to seal the treatment space, the driving member may be prevented from being broken.

In addition, according to an embodiment of the present invention, the vertical length of the clamp space is provided to be longer than the sum of the vertical length of a side portion of the upper body and the vertical length of a side portion of the lower body. Accordingly, the friction caused when the bodies are clamped is prevented, thereby minimizing the damage to the bodies and the production of the particles.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A substrate treating method using a substrate treating apparatus having a first body and a second body coupled together to form a treating space for treating a substrate, the substrate treating method comprising:
   an open step for opening the treating space by adjusting a relative position of the first body and the second body;
   a substrate introducing step for introducing the substrate to an opened treating space;
   a closing step for closing the treating space by adjusting the relative position of the first body and the second body; and
   a process treating step for treating the substrate by supplying a fluid to the treating space, and
   wherein at the process treating step,
   a pressure of the treating space is formed at a high pressure higher than a normal pressure by a fluid supplied to the treating space, a sealing member positioned within a sealing groove formed at the first body is modified to closely contact the second body by a pressure of the treating space, and a gap between the first body and the second body is sealed by a modified sealing member, and
   wherein
   the sealing member includes a concave portion facing the treating space, and
   the pressure of the treating space modifies the concave portion to open away from the treating space.

2. The substrate treating method of claim 1 further comprises a clamping step between the closing step and the process treating step for simultaneously clamping a first side of the first body and a second side of the second body with a clamping unit.

3. The substrate treating method of claim 2 further comprises a releasing step for releasing a driving force provided to the first body or the second body for adjusting a relative position of the first body and the second body, between the clamping step and the process treating step.

4. The substrate treating method of claim 3, wherein the driving force is provided by a cylinder.

5. The substrate treating method of claim 3, wherein at the releasing step a gap is formed between the first side and the second side, and wherein the first body and the second body closely contact the clamping unit, respectively.

6. The substrate treating method of claim 4, wherein the first body and the second body are positioned to face each other in an up/down direction, and a vertical length of a clamping space clamping the first side and the second side at the clamping unit is longer than a sum of vertical length of the first side and the second side inserted into the clamping space.

7. The substrate treating method of claim 1, wherein at the process treating step, the substrate is treated by the fluid in a supercritical state.

8. The substrate treating method of claim 1, wherein the process treating step is a step of drying the substrate by a supercritical fluid.

9. The substrate treating method of claim 1, wherein an end of the sealing member is fixedly coupled to the first body, and an end of the sealing member is provided as a free end.

10. The substrate treating method of claim 1, wherein the sealing member is moved in a direction toward the second body by the pressure of the treating space.

11. A method for treating a substrate using a substrate treating apparatus, the substrate treating apparatus comprising:

a first body and a second body coupled together to form a treating space for treating the substrate therein;

a substrate support unit for supporting the substrate at the treating space;

a fluid supply unit for supplying a fluid to the substrate supported by the substrate support unit; and a sealing member positioned between the first body and the second body so the treating space is closed from an outside at a position the first body and the second body closely contact each other; and a driving member for driving the first body or the second body so the treating space is opened or closed, and wherein the substrate treating method comprises:

a substrate introducing step for introducing the substrate to an opened treating space;

a closing step for providing a driving force for moving any one of the first body and the second body so the first body and the second body are in close contact;

a clamping step for simultaneously clamping a first side of the first body and a second side of the second body; and a process treating step for treating the substrate by supplying the fluid to the treating space, and wherein the sealing member is positioned within a sealing groove formed at the first body, and the sealing member seals a gap between the first body and the second body by closely contacting the second body by a pressure within the treating space at the process treating step, and wherein the sealing member includes a concave portion facing the treating space, and the pressure of the treating space modifies the concave portion to open away from the treating space.

12. The substrate treating method of claim 11, wherein at the process treating step, a pressure of the treating space is formed at a high pressure atmosphere higher than a normal pressure by a fluid supplied to the treating space.

13. The substrate treating method of claim 11 further comprises a releasing step for releasing the driving force between the clamping step and the process treating step.

14. The substrate treating method of claim 13, wherein the driving force is provided by a cylinder.

15. The substrate treating method of claim 13, wherein a vertical length of a clamping space clamping the first side and the second side at a clamping unit is longer than a sum of vertical length of the first side and the second side inserted into the clamping space, and Wherein at the releasing step, a gap between the first side and the second side is formed, the first body and the second body are closely contacting the clamping unit, and the space is closed by the sealing member.

16. The substrate treating method of claim 11, wherein an end of the sealing member is fixedly coupled to the first body, and an end of the sealing member is provided as a free end.

17. The substrate treating method of claim 11, wherein the sealing member is moved in a direction toward the second body by a pressure of the treating space.

18. The substrate treating method of claim 11, wherein a drying of the substrate is performed with a supercritical fluid at the process treating step.

* * * * *